(12) United States Patent
Kapoor

(10) Patent No.: US 7,687,335 B2
(45) Date of Patent: Mar. 30, 2010

(54) SELF ALIGNED GATE JFET STRUCTURE AND METHOD

(75) Inventor: Ashok Kumar Kapoor, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/235,164

(22) Filed: Sep. 22, 2008

(65) Prior Publication Data

US 2009/0017585 A1    Jan. 15, 2009

Related U.S. Application Data

(62) Division of application No. 11/450,112, filed on Jun. 9, 2006, now Pat. No. 7,560,755.

(51) Int. Cl.
    *H01L 21/337* (2006.01)
(52) U.S. Cl. .............................. 438/186; 257/E21.445
(58) Field of Classification Search ......... 438/186–196; 257/256, 268, 269, 272, E29.312, E21.445
    See application file for complete search history.

(56) References Cited

U.S. PATENT DOCUMENTS

| 3,719,535 | A |   | 3/1973  | Zoroglu ....................... 148/187 |
|-----------|---|---|---------|----------------------------------------|
| 4,912,053 | A |   | 3/1990  | Schrantz ....................... 437/29 |
| 5,122,851 | A |   | 6/1992  | Solomon ....................... 357/30 |
| 5,639,688 | A | * | 6/1997  | Delgado et al. ............. 438/586 |
| 5,702,987 | A |   | 12/1997 | Chen et al. ................... 438/187 |
| 5,824,575 | A |   | 10/1998 | Fujimoto et al. ............ 438/174 |
| 5,856,225 | A |   | 1/1999  | Lee et al. ..................... 438/291 |
| 5,929,481 | A |   | 7/1999  | Hshieh et al. ............... 257/328 |

FOREIGN PATENT DOCUMENTS

CN           1210371           3/1999

OTHER PUBLICATIONS

USPTO; *Notice of Allowance and Fee(s) Due* for U.S. Appl. No. 11/450,112, filed Jun. 9, 2006 in the name of Ashok Kumar Kapoor; 5 pages, Apr. 6, 2009.
*Notification of Transmittal of the International Search Report and the Written Opinion of the International Searching Authority* for International Application No. PCT/US07/70589; 9 pages, Dec. 6, 2007.

(Continued)

*Primary Examiner*—W. David Coleman
*Assistant Examiner*—Daniel Shook
(74) *Attorney, Agent, or Firm*—Baker Botts L.L.P.

(57) ABSTRACT

A JFET integrated onto a substrate having a semiconductor layer at least and having source and drain contacts over an active area and made of first polysilicon (or other conductors such as refractive metal or silicide) and a self-aligned gate contact made of second polysilicon which has been polished back to be flush with a top surface of a dielectric layer covering the tops of the source and drain contacts. The dielectric layer preferably has a nitride cap to act as a polish stop. In some embodiments, nitride covers the entire dielectric layer covering the source and drain contacts as well as the field oxide region defining an active area for said JFET. An embodiment with an epitaxially grown channel region formed on the surface of the substrate is also disclosed.

20 Claims, 24 Drawing Sheets

OTHER PUBLICATIONS

A. S. Grove; *Physics and Technology of Semiconductor Devices*; 2 pages, unknown.

S. M. Sze; *Physics of Semiconductor Devices*; 2 pages, unknown.

Adib R. Hamadé and José F. Albarrán; *A JFET/Bipolar Eight-Channel Analog Multiplexer*; IEEE Journal of Solid-State Circuits; vol. SC-10, No. 6; pp. 399-406, Dec. 1975.

Hiromitsu Takagi and Gota Kano; *Complementary JFET Negative-Resistance Devices*; IEEE Journal of Solid-State Circuits; vol. SC-10, No. 6; pp. 509-515, Dec. 1975.

Kurt Lehovec and Rainer Zuleeg; *Analysis of GaAs FET's for Integrated Logic*; IEEE Transactions on Electron Devices; vol. ED-27, No. 6; pp. 1074-1091, Jun. 1980.

Osamu Ozawa; *Electrical Properties of a Triode-Like Silicon Vertical-Channel JFET*; IEEE Transactions on Electron Devices; vol. ED-27, No. 11; pp. 2115-2123, Nov. 1980.

R. Zuleeg; *Complementary GaAs Logic*; McDonnell Douglas Astronautics Company; 70 pages, Aug. 4, 1982.

Lis K. Nanver and Egbert J. G. Goudena; *Design Considerations for Integrated High-Frequency p-Channel JFET's*; IEEE Transactions on Electron Devices; vol. 35, No. 11; pp. 1924-1934, Nov. 1988.

*USPTO; Office Action* for U.S. Appl. No. 11/450,112, filed Jun. 9, 2006 in the name of Ashok Kumar Kapoor; 7 pages, Feb. 9, 2009.

*State Intellectual Property Office of the People's Republic of China; The First Office Action* for Application No. 200780021526.6; 5 pages. Oct. 30, 2009.

* cited by examiner

PRIOR ART
CROSS-SECTION OF NORMALLY OFF JFET (N-CHANNEL)

DOPING PROFILE OF A JFET THROUGH THE GATE AND CHANNEL

PLAN VIEW OF FINISHED STRUCTURE

FINISHED JFET

AFTER FORMING CHANNEL

ALT EMB= SIDEWALL THERMAL OXIDE

AFTER FORMING CHANNEL

AFTER 2ND OXIDE ETCH STARTING FROM FIG. 12

US 7,687,335 B2

SELF ALIGNED GATE JFET STRUCTURE AND METHOD

CROSS-REFERENCE TO RELATED APPLICATION

This application is a divisional of U.S. application Ser. No. 11/450,112 filed Jun. 9, 2006, which is hereby incorporated herein by reference.

TECHNICAL FIELD OF THE INVENTION

The invention pertains to a device structure and method for making JFET transistors at very small line widths which can overcome certain process problems in CMOS circuits built with small line widths.

BACKGROUND OF THE INVENTION

As line widths have shrunk steadily down into the submicron range (today's line widths are 45 nanometers or 0.045 microns where a micron is $10^{-6}$ meters and one nanometer equals 10 angstroms), all structures on CMOS, NMOS and PMOS circuits have shrunk including the thickness of the gate oxide. As line widths shrink, the voltages must be dropped to avoid punch through. This shrinking line width means smaller gate length which requires that the thickness of gate oxide must also be reduced to allow proper control of the current flow in MOS devices at the lower voltages. Reduced gate oxide thickness results in increased gate capacitance per unit area which has to be switched. Since smaller geometries imply increased circuit density, the result is an overall increase in the power needed for to operate the chip. In addition, shrinking gate oxide thickness causes leakage which increases power consumption in CMOS circuits and all other MOS circuits. The limit of gate oxide thickness that will not cause leakage is about 30 nanometers, which was used in older technologies with minimum line widths of 10 NM while 45 nanometer line widths (0.045 microns) are the state of the art now.

At one micron line widths, power consumption for a one square centimeter integrated circuit was 5 watts. As line widths shrank to 45 nanometers, power consumption for the same size chip rose to 1000 watts. This can destroy an integrated circuit which is not cooled properly and is unacceptable for portable devices such as laptops, cell phones etc. This power consumption complicates the design process immensely because it requires circuitry to put transistors that are not working to sleep so they do not waste power. Prior art junction field effect transistors date back to the 1950's when they were first reported. Since then, they have been covered in numerous texts such as "Physics of Semiconductor Devices" by Simon Sze and "Physics and Technology of Semiconductor Devices" by Andy Grove. Junction field effect devices were reported in both elemental and compound semiconductors. Numerous circuits with junction field effect transistors have been reported, as follows:

1) Nanver and Goudena, "Design Considerations for Integrated High-Frequency P-Channel JFET's", IEEE Transactions Electron Devices, Vol. 35, No. 11, 10 1988, pp. 1924-1933.

2) Ozawa, "electrical Properties of a Triode Like Silicon Vertical Channel JFET", IEEE Transactions Electron Devices Vol. ED-27, No. 11, 1980, pp. 21152123.

3) H. Takanagi and G. Kano, "Complementary JFET Negative-Resistance 15 Devices", IEEE Journal of Solid State Circuits, Vol. SC-10, No. 6, December 1975, pp. 509-515. 4) A. Hamade and J. Albarran, "A JFET/Bipolar Eight-Channel Analog Multiplexer", IEEE Journal of Solid State Circuits, Vol. SC-16, No. 6, December 1978. 5) K. Lehovec and R. Zuleeg, "Analysis of GaAs FET's for Integrated Logic", 20 IEE Transaction on Electron Devices, Vol. ED-27, No. 6, June 1980. In addition, a report published by R. Zuleeg titled "Complimentary GaAs Logic" dated 4 Aug. 1985 is cited herein as prior art.

A representative structure of a conventional, prior art n-channel JFET is shown in FIG. 1. The JFET is formed in an n-type substrate 810. It is contained in a p-well region marked 815. The body of the JFET is shown as 820, which is an n-type diffused region containing source (832), channel (838), and drain (834) regions. The gate region (836) is p-type, formed by diffusion into the substrate. Contacts to the source, drain, and gate regions are marked as 841, 842, and 840, respectively. The critical dimension of the JFET is the gate length, marked as 855. It is determined by the minimum contact hole dimension 850, plus the necessary design rules overlap required to ensure that the gate region encloses the gate contact. The gate length 855 is significantly larger than 850. This feature of construction of the prior art JFET limits the performance of these devices, since channel length is substantially larger than the minimum feature size. In addition, the capacitances of the vertical sidewalls 861 and 862 of the gate diffusion 836 to drain and source regions 832 and 834, respectively, are also quite large. The gate-drain sidewall capacitance forms the Miller capacitance, a term known to those skilled in the art, and significantly limits the performance of the device at high frequencies.

In order to substitute JFETs for CMOS to solve the power consumption problem at line widths of 45 NM and smaller, it is necessary to have a normally off JFET with very small gate capacitance in comparison to MOS transistors of comparable geometry, and with very small parasitic capacitance. It is also desirable to have a self aligned gate in such JFET devices with respect to the channel. It is therefore desirable to be able to fabricate the gate electrode without using a mask by etching a self aligned hole in spacer oxide to achieve these targets.

One solution to the increasing power consumption problem of conventional CMOS as line widths shrink is the normally off junction field effect transistor or JFET which was invented by Ashok Kapoor and described in a patent application entitled Complementary Junction Field Effect Transistor Circuit in Silicon and Silicon Alloys, filed Oct. 28, 2005, Ser. No. 11/261,873, which is hereby incorporated by reference. A conventional normally-on JFET looks like the structure shown in FIG. 1.

One embodiment of Dr. Kapoor's JFET structure is shown in FIG. 2. This figure is a cross section of a N-channel JFET which has had its doping levels and dimensions designed such that it operates in mode. The JFET has four terminal regions in the substrate and corresponding contacts above the substrate surface. The terminal regions in the substrate are: source 31 (comprised of a diffusion region under polysilicon contact 72 and an implanted region coupling the diffused region to the channel region 50); gate 70; drain 40 (comprised of a diffusion region under polysilicon contact 74 and an implanted region coupling the diffused region to the channel region 50) and P-well 11 which has an ohmic contact region shown at 68. The contacts to the source, drain, gate and P-well regions are made of polysilicon typically and are: substrate contact 71, source contact 72; gate contact 75 and drain contact 74. The JFET is formed in a region of silicon substrate 15 in FIG. 2. The JFET is isolated from the surrounding semiconductor by insulating regions 21, which are typically Shallow Trench Isolation (hereafter STI) field oxide. The channel between the source and drain is shown at 50. For an N-channel JFET, the source and drain regions 31 and 40 are N+ regions (highly doped with N type donor impurities such as phosphorous, arsenic or antimony). The P well 11 is doped P type with acceptor impurities such as boron or indium. Contact to the P well is formed by poly contact 71 which is doped heavily P type and which, by diffusion during the drive in process to form the gate, forms an ohmic contact and a P+ region 68 which acts as the P well contact by virtue of the configuration of the field oxide regions 21 as shown. The field oxide regions must not extend below the depth of the P well to substrate junction 87 so as to not cut off a conductive path from the ohmic contact 68 to the P well portion 11 under the channel region 50. The channel is a narrow region 50 which is doped lightly N type. The gate is a very shallow (typically 10 nanometers, hereafter NM) P type region formed in the N type channel by methods such as diffusion of dopants from the overlying heavily P+ doped polysilicon 75 or ion implantation. A doping profile of the transistor at varying depths from the surface through the gate 70 and channel 50 is shown in FIG. 3. The drive-in process to form the gate region 70 and the implant to form the channel region 50 are both important because the depth of these regions and their doping must be controlled so that the depletion regions of the gate-channel junction and the channel-P well junction formed with zero volt external bias on gate and well with respect to source touch so as to cause pinch off. Curve 81 is a typical gate doping profile and point 85 is typically only about 10 NM from the substrate surface so the gate is very shallow. This requirement is a significant part of the solution to the problem that the invention solves. Curves 82, 83 and 84 represent the doping profile of the channel 50, the P well 11 and the substrate bulk regions 15 respectively. The depth of the gate-channel junction is at point 85. The depth of the channel-P well junction is at point 86 and is typically only 40 NM down from the surface of the substrate. The depth of the well-substrate junction is shown at 87. Each junction has a depletion region on either side of the junction even when the junction has zero bias across it.

As alluded to earlier, the key to designing a normally off or enhancement mode JFET is to design the device such that the depletion region surrounding the gate-channel junction 85 to be large enough to extend down to the boundary of the depletion region surrounding the channel-well junction 86 (or channel-substrate junction 86 in the case of embodiments of FIGS. 5C and 15). This pinches off current flow when the gate bias is zero volts thereby making an enhancement mode device. The depletion regions around each junction have a fixed width at zero bias. How far above and below a PN junction the depletion region spreads depends upon the relative doping concentration of the semiconductor above and below the junction. The doping concentration of the regions on either side of junctions 85 and 86 and the size of the gate and channel regions are coordinated so that pinch off occurs.

FIG. 4 is a blown up view of the gate and channel regions showing the boundaries 90 and 91 of the depletion region around the gate-channel junction 85 in a conventional normally-on JFET. The depletion region around the channel-well junction 86 is marked by an upper boundary 92 and a lower boundary 94. The boundary 91 in the channel region 50 is nearly coincident with the upper boundary 92 of the depletion region around the channel-P well junction 86, but because they are not coincident, no pinchoff occurs, and current flows in the neutral region. When the doping of the gate, channel and will regions and junction depths are such as to cause this condition shown in FIG. 4, the device is called a normally on or depletion mode device because it takes some gate bias to turn off current flow from the source to the drain by causing pinchoff, i.e., a condition where the depletion region boundary 91 meets the depletion region boundary 92. Conversely, the doping of the gate, channel and well regions and the junction depths can be controlled so as to cause pinchoff at a much smaller positive or zero gate bias, and such a device is called a normally off or enhancement mode device. More specifically, in a JFET, the doping of the channel region versus the doping of the gate region and the relative depths of the gate-channel junction 85 versus the channel-P well junction and the doping of the semiconductor under junction 86 can all be controlled such that boundary 91 touches boundary 92 at zero gate bias or a gate bias of less than one volt. This causes pinch off so very little current flows from source 31 to drain 40 through channel 50. When a positive bias is applied across the gate-channel junction to reduce the width of the depletion region, it takes the device out of pinchoff so as to allow conduction between the source and drain.

The JFET of FIG. 2 requires two separate masks to dope the single polysilicon layer so that the portions over the source and drain can be doped N+ and the portions over the gate and P well contact can be doped P+. As feature sizes get smaller, alignment of features created by different mask layers becomes more difficult and design rule tolerances eat up valuable chip real estate. It is desirable to reduce the area of the JFET by doing a dual conductive semiconducting layer deposition with a self-aligned gate contact to reduce device area hereafter referred to as a "dual poly" process even though the first conductive layer from which the source and drain contacts are formed need not be polysilicon and can be metal. Dual poly bipolar devices are known so there is a large body of knowledge on how to do dual poly construction. However, to the applicant's knowledge, no dual poly JFET integration processes exist.

Therefore, a need has arisen for a method of building a JFET which has low parasitic capacitances, reduces the number of masks involved in the process for polysilicon processing and which results in formation of a self-aligned gate contact.

SUMMARY OF THE INVENTION

The genus of processes according to the teachings of the invention result in a JFET being constructed which has a self-aligned gate contact. This is achieved by forming the gate contact from a second polysilicon layer (although the first layer from which the source and drain contacts are made may not be polysilicon and can be some other conductor) which is deposited into an opening formed by formation of spacer oxide around the source and drain contacts. The opening exposes a portion of the active area between what will become the source and drain regions of the JFET. This form of construction eliminates lithography issues in aligning a gate mask with the source and drain mask. Nitride layers on top of spacer insulator atop the source and drain contacts act as a polish stop. A nitride layer covering the field oxide prevents over etching which can render the device inoperative.

DETAILED DESCRIPTION OF THE INVENTION

Figure 5A:
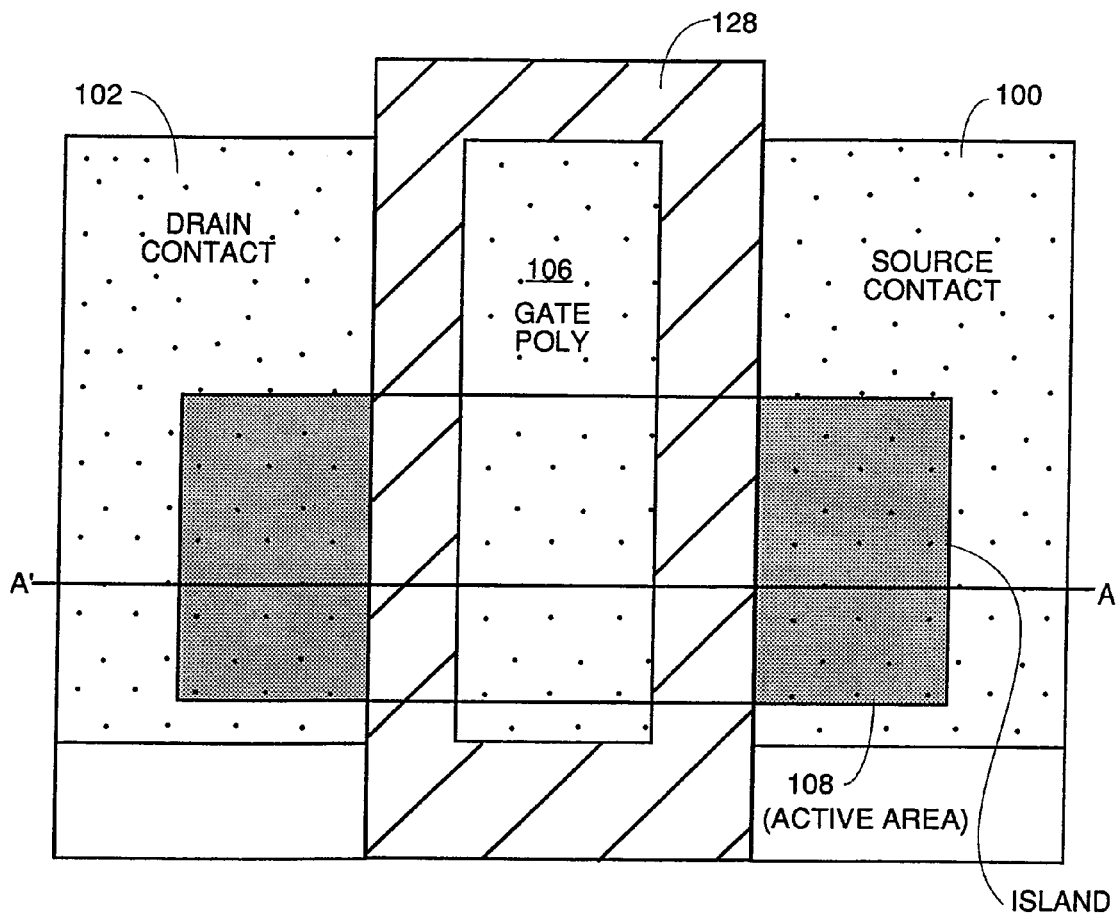
FIG. 5A is an exemplary plan view of the finished JFET according to the preferred embodiment of the invention.

FIG. 5A is a plan view of the finished JFET according to one embodiment of the invention. Source contact 100 is preferably made from first polysilicon (hereafter poly), but it may also be made from some refractory metal or silicide or a combination of polysilicon, silicide and refractory metal. The same is true for drain contact 102. An insulating spacer 128 called spacer dielectric structures in the claims, typically silicon dioxide, separates the drain and source contacts from a self-aligned gate contact 106 made from "second" poly (second poly means whatever doped semiconductor or conductor is used to form the gate contact and does not require that the source and drain contacts be formed of first poly).

Spacer dielectric structure 128 may also be comprised of multiple layers of dielectric material such as silicon dioxide and silicon nitride ($Si_3N_4$), and the term should be so interpreted in the claims. Box 108 represents the active area in the substrate which is electrically isolated by a field area of insulating material which is typically Shallow Trench Isolation silicon dioxide. The term "field area" in the claims means any insulating layer formed in the substrate to define an active region and may not necessarily be silicon dioxide. Shallow Trench Isolation is preferred because it makes it easier than LOCOS to form very small active areas.

The gate contact 106 and any well contact (if used) are formed from the second polysilicon layer.

Figure 5B:
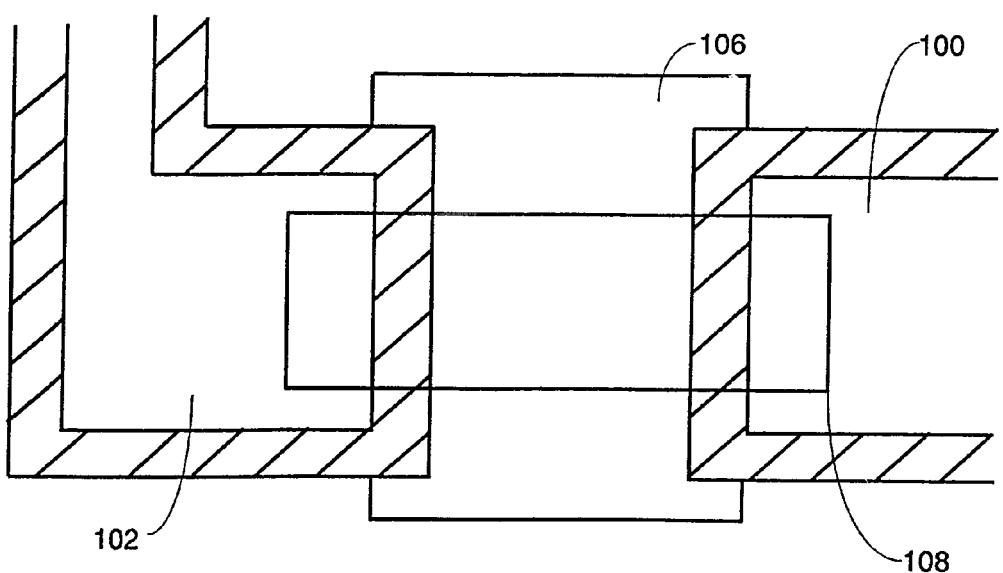
FIG. 5B is an alternate plan view of the finished JFET.

FIG. 5B is another exemplary layout for the JFET. The source, drain and gate contacts and the active area are given the same reference numbers as they have in FIG. 5A.

Figure 1:
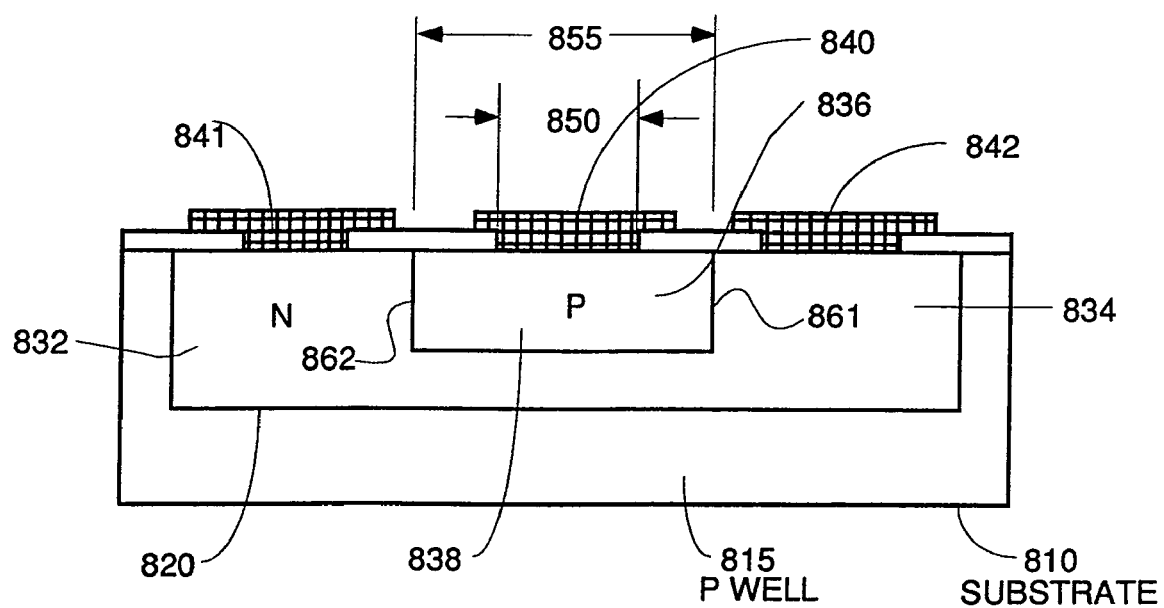
FIG. 1 is a cross-sectional view of a prior art JFET.
Figure 2:
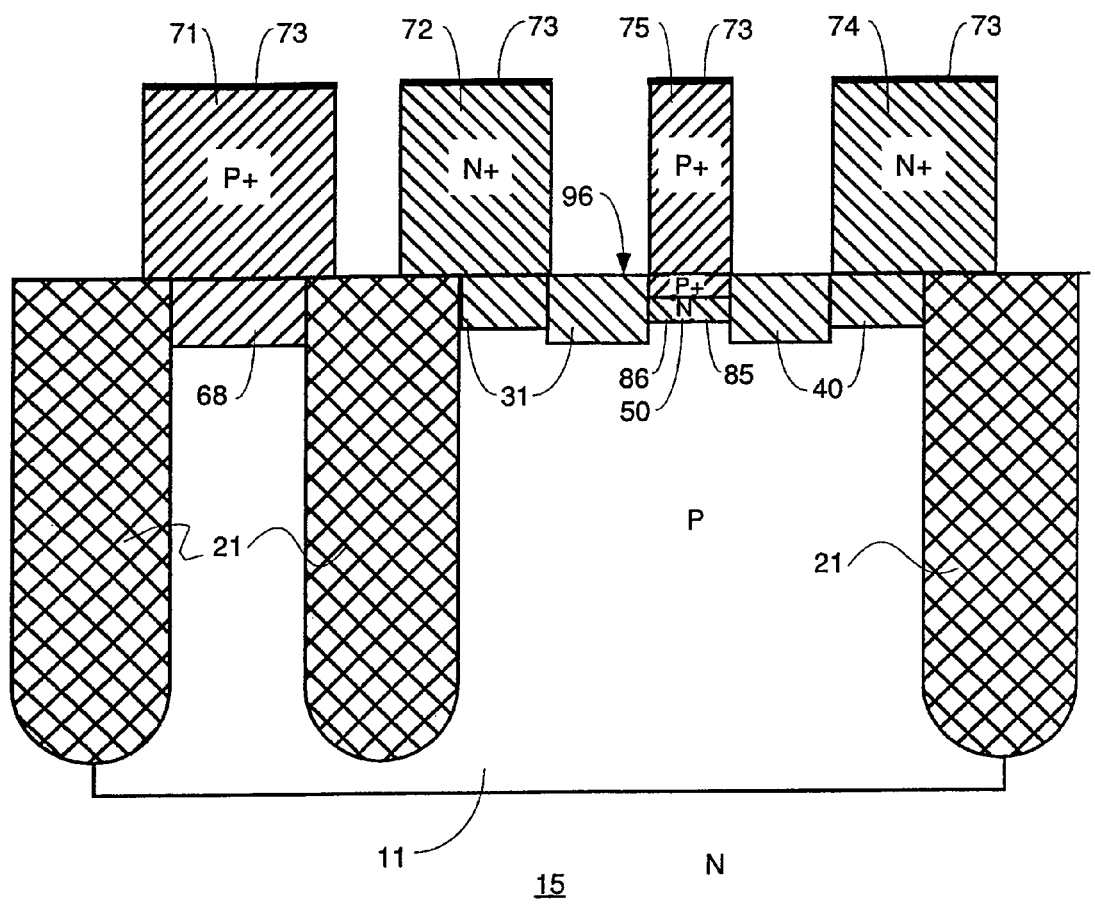
FIG. 2 is a cross-sectional view of one embodiment of a JFET previously invented by co-inventor Ashok Kapoor.
Figure 3:
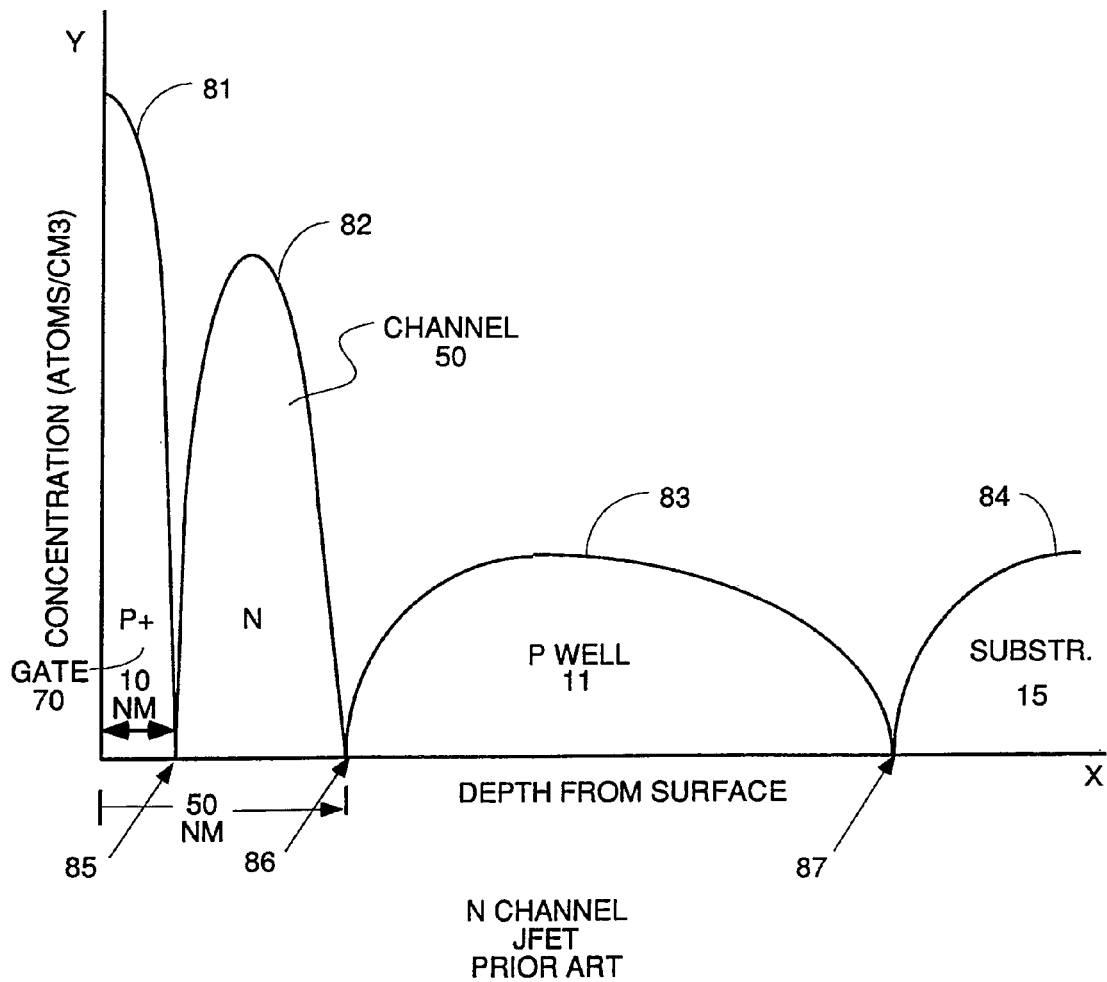
FIG. 3 is a typical doping profile for a JFET like that shown in FIG. 2 and JFETs according to the teachings of the invention (N channel shown, doping polarities are reversed for P channel JFETs).
Figure 4:
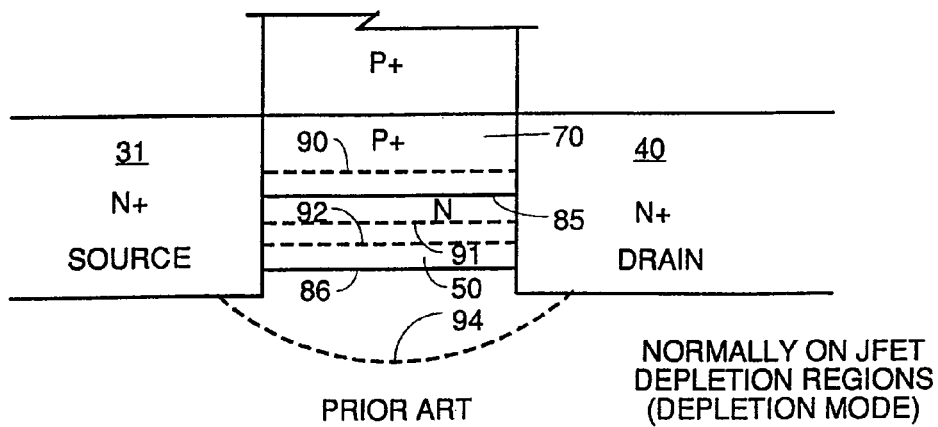
FIG. 4 is a close up view of the channel and gate regions of the JFET according to FIG. 2 and JFETs according to the invention showing how the depletion regions are extended to cause pinch off.
Figure 5C:
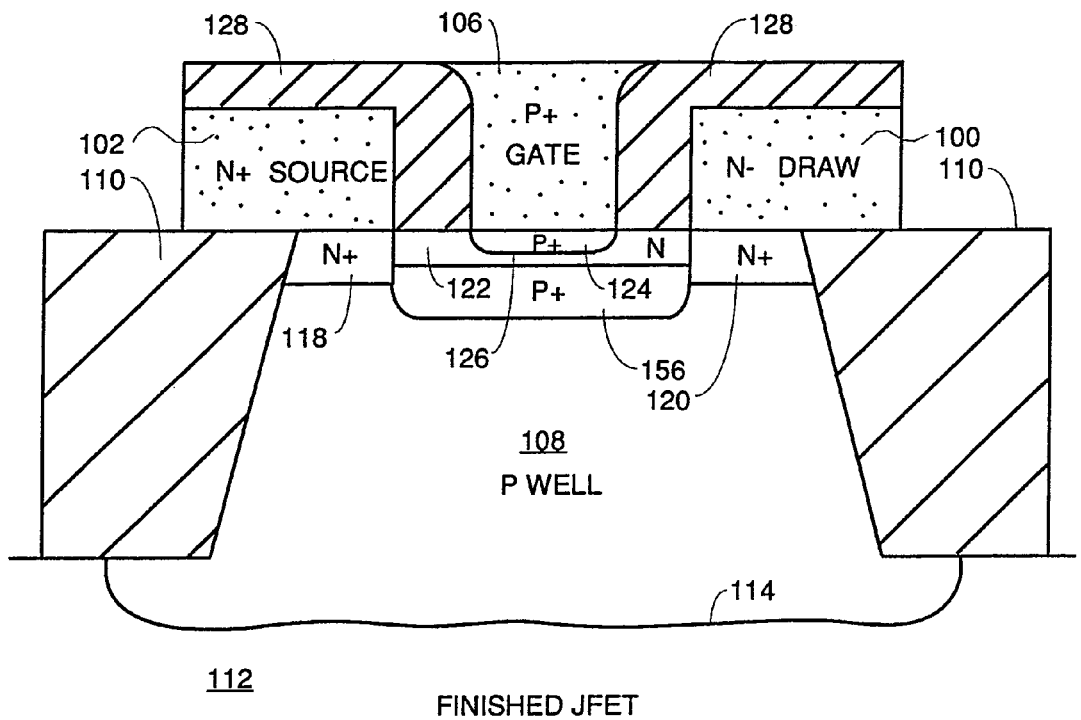
FIG. 5C is a sectional view of the finished JFET according to the preferred embodiment of the invention taken along section line A-A in FIG. 5A (the well contact is not shown because it is understood by those skilled in the art as always there and is shown in FIG. 5D).
Figure 5D:
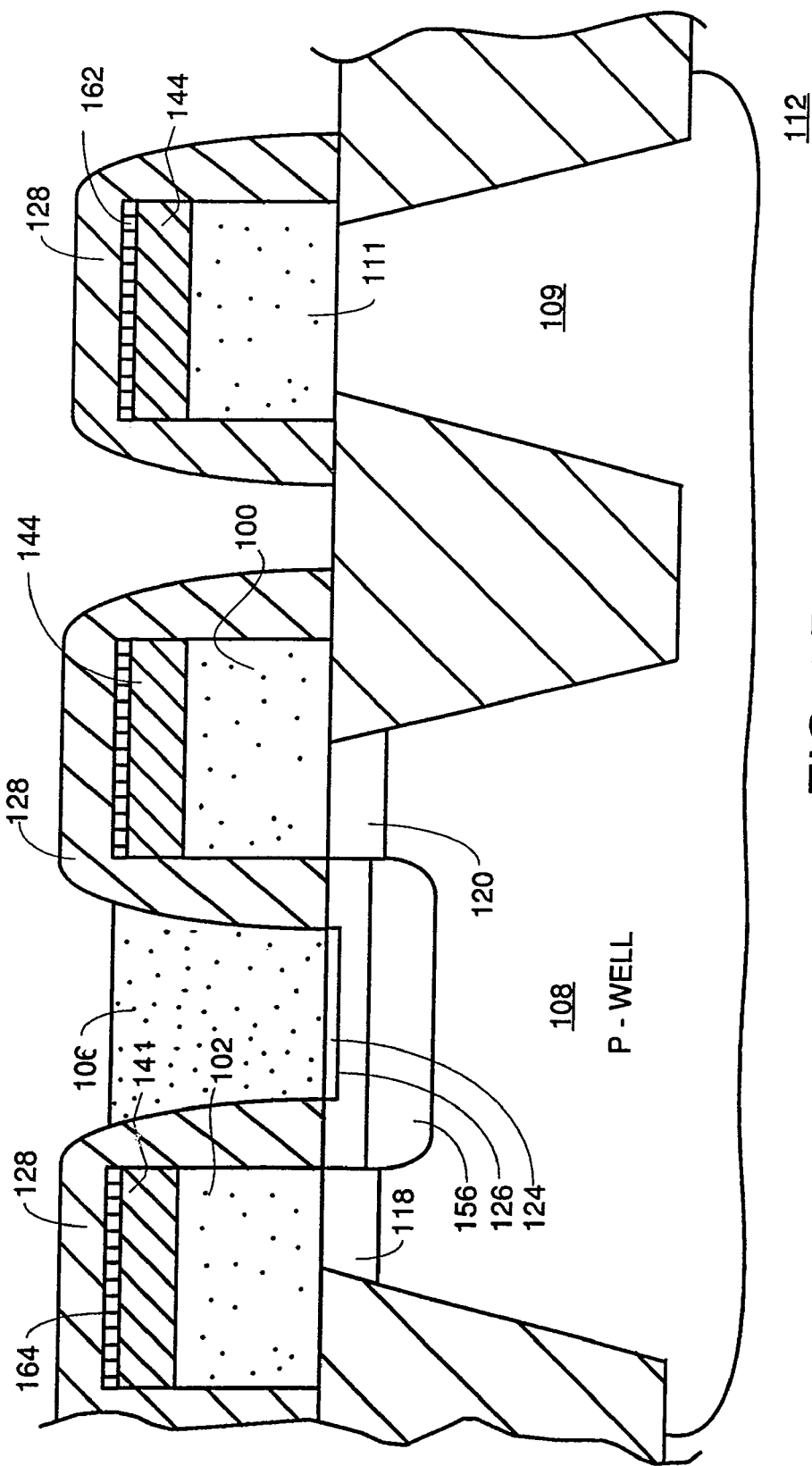
FIG. 5D is a sectional view of the finished JFET, including the well tap, according to the preferred embodiment of the invention taken along line A-A' in FIG. 5A.

FIG. 5C is a sectional view of the finished JFET according to the preferred embodiment of the invention taken along section line A-A' in FIG. 5A through the active area. The well contact is not shown because it is understood by those skilled in the art as always there and is shown in FIG. 5D. Field oxide regions 110 surround and define P well active area 108 and electrically isolate the P well from neighboring structures integrated into N type silicon substrate 112. In some embodiments, the substrate can be an insulating substrate with a single crystal semiconductor layer formed on top thereof. That semiconductor layer can then be doped appropriately. Hereafter, references to the substrate should be understood as referring to either variant unless otherwise stated. Field oxide 110 is formed by a process known to those skilled in the art as Shallow Trench Isolation. P well 108 is extended laterally and the field oxide forms a second isolated region of P well 109 as shown in FIG. 5D which extends all the way to the surface and which has an electrically conductive contact structure 111 formed thereover. A typical well contact structure is shown in FIG. 2 where contact 71 is the back gate contact and is formed of P+ doped poly for an N channel device. The device of FIG. 5D shows the source, drain and gate contacts all made of polysilicon and capped with a layer of oxide 144 topped by a layer of nitride 162.

Source and drain contacts 102 and 100 are preferably P+ doped first polysilicon, but they can also be silicide or refractory metal which has been implanted with N type impurities for an N channel device or P type impurities for a P channel device. In the claims and throughout this description, when an implant step is mentioned, it should be understood as including an annealing step either at the time of the implant or later to distribute the implanted ions more uniformly throughout the material being implanted. In the claims, the phrase "to a high concentration level" should be understood to mean a P+ or N+ level (depending upon whether a P channel or N channel device is being built) as those terms understood by person skilled in the art—typically 1E18 to 1E21 impurity concentration levels.

These implanted dopant impurities are driven into the underlying semiconductor of the P well 108 to form N+ doped source and drain regions 108 and 120 in a high temperature drive in step. The annealing step used after implants and the high temperature drive in step can be separate steps or combined into one step. An N type channel region 122 has been previously formed by implantation. A P+ gate region 124 is formed with a shallow junction 126 by driving impurities into the channel regions 122 from a P+ doped second polysilicon contact 106 formed over the channel region. Cross-hatched area 128 is insulating material such as silicon dioxide which serves as a spacer dielectric structure which insulates the self-aligned gate contact 106 from the source and drain contacts 102 and 100. The use of this spacer dielectric structure and the process to form it in the opening etched for the gate contact makes the gate contact self-aligned. The gate contact is self-aligned because only one mask is needed to form both the source, drain and gate contacts. That one mask defines the location to etch the first conductive layer, typically polysilicon, to define the source and drain contacts. That leaves an opening over the active area where the gate contact can be formed. Spacer oxide is then formed in that opening in the process to be described below, and formation of the spacer oxide leaves an opening down to and exposing the surface of the active area between the source and drain contacts. This opening is then filled with polysilicon and the poly is doped to form the gate contact. Thus, because only one mask was needed to form all of the source, drain and gate contacts, the gate contact is self-aligned because no mask for etching the gate contact hole was necessary. If such a mask had not been used, it would have had to have been aligned with the mask used previously to form the source and drain contacts and misalignment errors could have occurred requiring the use of design rule margins for misalignment error which increase the size of the transistor and make it slower, increasing the chip area at the same time.

In the preferred embodiment, a layer of nitride is formed on the upper surface of said insulating material to act as a polish stop to prevent a later polishing step to remove excess poly from a second poly layer from polishing all the way through said insulating material and damaging said source and drain contacts. What is new about the structures of FIGS. 5C and 5D for a JFET is that source and drain contacts 102 and 100 are built first by a first conductive layer deposition followed by formation of spacer insulator 128 followed by deposition of a second conductive layer deposition which is polysilicon. The result is a self-aligned gate, and fewer masks are used. In some embodiments, a layer of nitride is formed on top of said spacer insulator layer before deposition of said second conductive layer. In other embodiments, a layer of nitride is formed on the top surface of the field oxide (typically STI) to protect if from over etching when the spacer oxide layer is etched.

The Process of Construction

Figure 6:
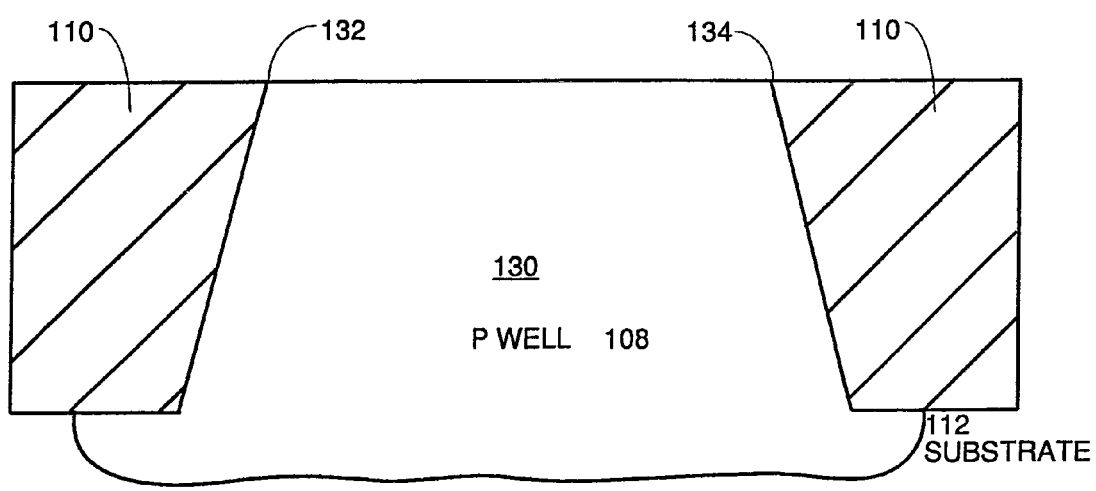
FIG. 6 is a cross section through the JFET at a preliminary step after defining the active area.
Figure 21:
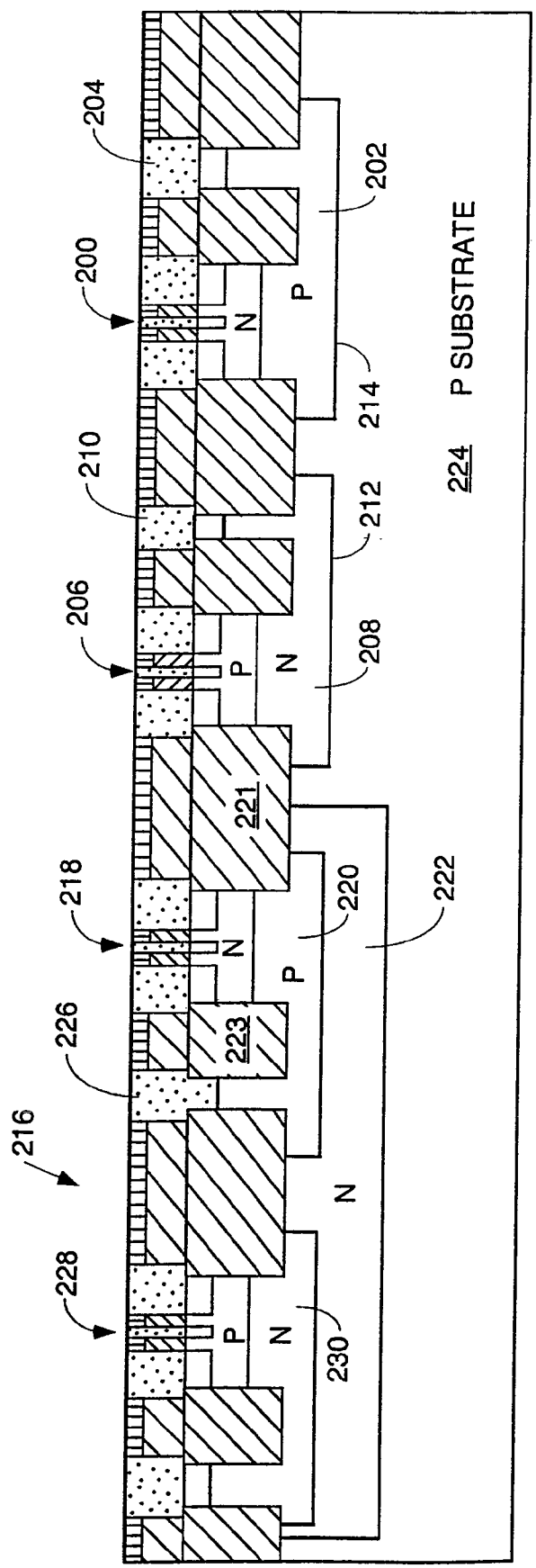
FIG. 21 shows two different well structures to isolate complementary self-aligned JFETs, one of these wells being a triple well structure.

Referring to FIG. 6, there is shown a cross section through the JFET at a preliminary step after defining the active area. The process typically starts with <100> N-doped silicon semiconductor substrate doped to 10 ohm-centimeter resistivity typically, although other resistivities and semiconductor type and crystal orientations may be acceptable in other embodiments. Field area 110 is formed by forming insulating material in the substrate so as to define an active area 130 (which is coincident with the P well 108) where the JFET structure will be formed. In the preferred embodiment, the field area 110 is formed by Shallow Trench Isolation oxidation to form a region of silicon dioxide which is approximately 1000 angstroms to one micron thick in a 45 NM line width device. Shallow Trench Isolation is preferred over LOCOS oxidation because the corners at 132 and 134 are sharper and smaller device structures can be made than is the case with the bird's beak structure created by LOCOS. Because the bird's beak structure typically has oxide which extends into the active area beyond the edge of the mask by 0.1 microns, a mask defining an active area which is 0.2 microns wide will not be able to reliably form an active area in a LOCOS field oxidation process so small devices cannot be made. The process described here is for forming a stand alone device. If an inverter with P channel and N channel devices in close proximity is to be formed, then the devices must be electrically isolated from each other. In such a case, implants are made to form a P-well in one active area in which the N channel device will be formed and an N-well in another active area where the P channel device is to be formed. Each P-well or N-well has a contact to it at the surface of the substrate so that the well-substrate junction can be reverse biased so as to eliminate conduction from the active area of the N channel device to the active area of the P channel device and vice versa. FIG. 21 shows two different well structures to isolate complementary self-aligned JFETs. N channel JFET 200 is built in a P well 202 which has a surface contact 204. P channel JFET 206 is built in an N well 208 having a surface contact 210. Surface contacts 204 and 210 can be used to reverse bias the back gates 214 and 212, respectively, to isolate the two devices. A triple well structure is shown generally at 216. In this structure, a self-aligned gate, N channel JFET 218 is built in a first active area (defined by STI areas 221 and 223) in P well 220 which is enclosed in an N well 222 formed in substrate 224. The P-well has a surface contact 226. A self-aligned gate, P channel JFET 228 is built in an N well 230 which is also enclosed in N-well 222. In the claims, the phrase "a self-aligned gate, N channel JFET" means any of the preferred and alternative embodiment JFET structures defined herein doped as N channel in either enhancement mode or depletion mode. Likewise, the phrase "a self-aligned gate, P channel JFET" means any of the preferred and alternative embodiment JFET structures defined herein doped as P channel devices in either enhancement mode or depletion mode.

Figure 7:
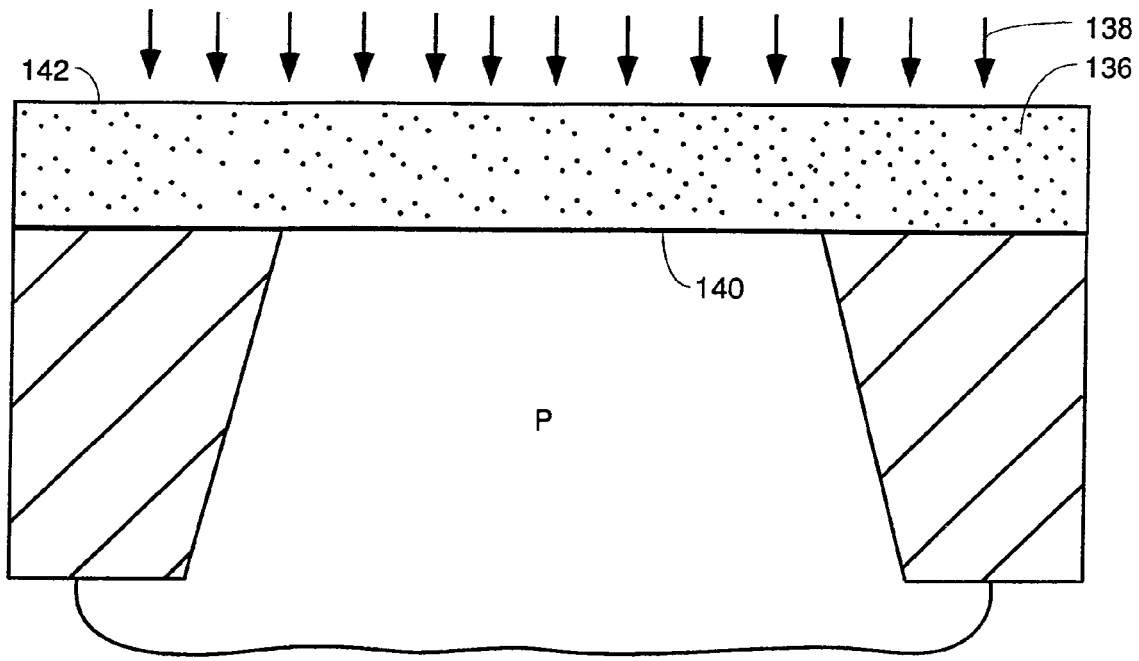
FIG. 7 is a cross section through the device at an intermediate stage after first poly deposition.

FIG. 7 is a cross section through the device at an intermediate stage after "first poly" deposition. Other conductors such as refractive metals or silicide can be used for the first conductive material layer 136, but in the preferred embodiment, layer 136 is a polysilicon (poly) layer which is preferably from 20 nanometers to 0.5 microns thick. The term first conductive material in the claims should be understood as meaning this first poly layer as well as refractory metals or silicide. This first poly layer, after doping, is the conductive material from which the source and drain contacts will be formed. Doping of this first poly layer is preferably by ion implantation but other methodologies for doping layer 136 may also be used such as plasma immersion doping, thermal diffusion and similar processes. In the claims, the step of doping this first conductive material layer should be interpreted as covering any way of causing the first conductive material layer to be more conductive if it is not already highly conductive when deposited or first formed. The particular dopant material used depends upon whether the device being constructed is an N channel device or a P channel device. The process illustrated is for an N channel device so N type impurities are implanted, as represented by arrows 138. Typically, multiple implants are done, one at a lower energy and one at a higher energy so as to get doping peaks at two different depths in the poly resulting in greater uniformity of dopant distribution in polysilicon. For example, if the first poly layer was 50 NM thick, one implant would have its energy set to have a peak of the concentration about 20 NM up from surface 140 and the other would have its energy set to establish a peak at approximately 10 NM down from surface 142. In the preferred embodiment, no annealing step is performed at this point in the process to redistribute the implanted impurities in the poly. In an alternative embodiment, low temperature annealing is performed at this step. In the claims, the steps of depositing the first conductive layer and doping it should be understood as including an annealing step at any time and this annealing step could be combined with a high temperature drive in step to form the gate and possibly the source and drain regions if doped polysilicon is used for the first conductive layer. The step of forming the source, drain region should be understood as including a high temperature diffusion to drive impurities from source and drain contacts of the first poly layer. If the source and drain contacts are formed of refractory metal or silicide on top of polysilicon, the source and drain areas are formed by an implant either before or after formation of the source and drain contacts and an annealing step. In an alternate embodiment, a masking step will be used to define the areas for the source and drain implants.

Figure 8:
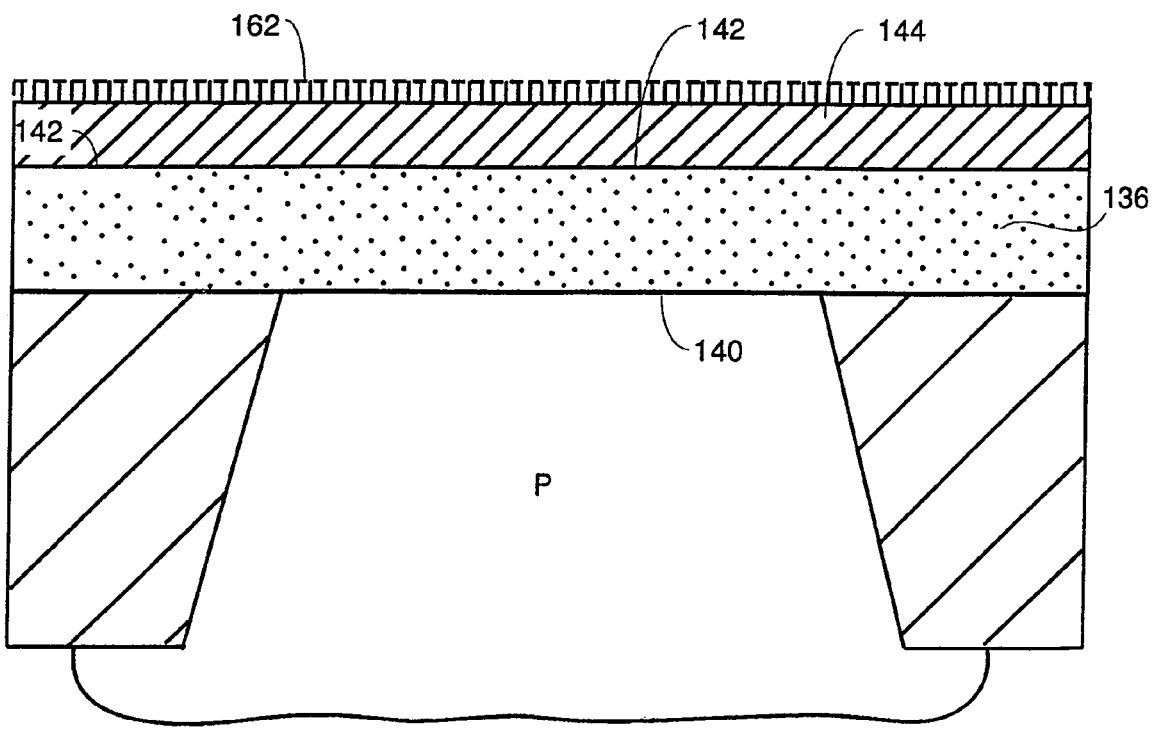
FIG. 8 is a cross section of the structure after a layer of dielectric 144 is deposited over the first conductive layer 136.

FIG. 8 is a cross section of the structure after a first layer of dielectric 144 is deposited over the first conductive layer 136. This dielectric layer 144 can be silicon dioxide or nitride, low K silicon dioxide or other dielectrics. Layer 144 can also comprise multiple layers of the various dielectric materials mentioned above. Typical thicknesses for this dielectric layer are from 10 NM to 500 NM. This layer functions as a spacer and an insulator to insulate the tops of the source and drain contacts from the second poly and to allow flexibility in forming the source and drain contacts without interference from any overlying conductive structures such as metal lines. In an alternative embodiment, dielectric layer 144 is comprised of a layer of oxide with a thin layer 162 of nitride formed on top thereof to act as a polish stop. This thin nitride layer is symbolized by dashed line 162. After the etching described below to form separate source and drain contacts, this nitride cap is referenced as layers 164 and 162 on the source and drain contacts, respectively. The nitride layer 162 and 164 also covers polysilicon layer 136 on top of the field oxide areas outside the active area. This is necessary to prevent the field oxide from being notched outside the active area later during an etch step to form spacer dielectric structures around the source and drain contacts and to expose an opening to the active area. The etch to form these spacers, in the absence of the nitride layer, will etch the field oxide down at areas 200 in FIG. 14 to a level below the surface of the substrate. This can cause a short between the gate polysilicon and the well. Therefore, when the gate is biased, the P well is also biased which is undesirable, so it is necessary to prevent the field oxide from being etched in some way when the spacer dielectric structures 128 in FIG. 15 are formed.

Figure 9:
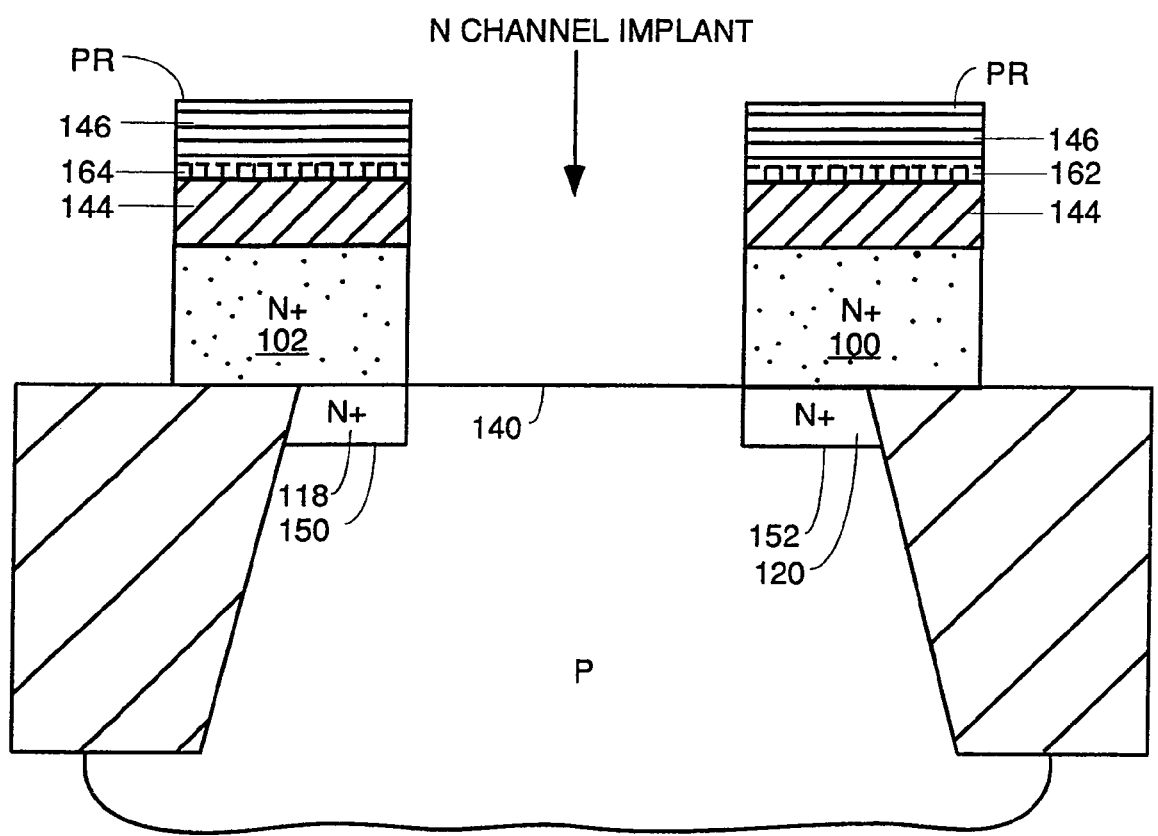
FIG. 9 is a cross section of the structure after masking a layer of photoresist 146 to expose the portion of the active area 140 where the channel region is to be formed, and after etching the layer of dielectric 144 and polysilicon.

FIG. 9 is a cross section of the structure after masking to develop a layer of photoresist 146 which exposes the regions where the first polysilicon 100 and the corresponding dielectric layers have to be removed by plasma etching or a suitable process, to expose the region 140 where the channel region is to be formed. This photolithography and etch step also defines the size and shape of the source and drain contacts 102 and 100. After masking, an etch step then removes the exposed oxide or other insulator 144 and the portion of the first conductive layer 136 over the channel region 140 and the field region. In an alternative embodiment, the photoresist is removed from the wafer and the wafer is subjected to thermal cycle to cause the dopant to diffuse through the conductive layer 102 and 100 near the surface of silicon, and dope the silicon to form the source and drain contacts 118 and 120 respectively. The channel region 122 is then formed by one or more implants to dope the channel region N type for an N channel device or P type for a P channel device. An optional second P+ implant for an N channel device is performed to form the P+ region 156 underneath the channel 122 in FIG. 10 to achieve greater control of the drain current of the JFET by the well bias. After the implant(s), the resist layer 146 is removed from the wafer. Then, a thermal drive in bake is done to allow dopant impurities in the overlying source and drain contacts to diffuse into the substrate to form source area 118 and drain area 120. This P+ well implant can be performed either before or after the channel implant, and is typically boron or BF2 implanted in one or more implants at energy levels from about 1 KEV to 200 KEV so as to deposit most of the P type impurities below the junction 154. In the claims, the term "predetermined doping levels and junction depths" is intended to refer to proper doping impurity concentrations and junction depths to achieve the desired enhancement mode or depletion mode type of JFET device. If an enhancement mode device is desired, the P+ concentration (or N+ in the case of a P channel JFET) of the gate region and the concentration of impurities of the channel and well regions are controlled to be at a level which is sufficiently high and the junction depths of the gate-channel junction and the channel-well junction are controlled to force the depletion regions to merge thereby causing pinchoff at zero gate bias. If a depletion mode device is to be built, these same factors are controlled so as to achieve pinchoff at some higher, desired level of gate bias.

The first polysilicon layer 136 is highly doped in the implant symbolized by FIG. 7 in order that it may be used for the source and drain contacts and to drive sufficient impurities into the active area to form the source and drain regions. The dopant concentration is established in the first poly layer 136 to be in the range of $10^{18}$ to $10^{21}/cm^3$. After the drive in, the dopant concentration in the source and drain areas 118 and 120 is also $10^{18}$ to $10^{21}/cm^3$. The time and temperature of the drive in step is controlled to establish the junction depth for the source-well junction 150 and the drain-well junction 152 anywhere from 1 NM to 150 NM down from the top surface 140 of the substrate.

Figure 10:
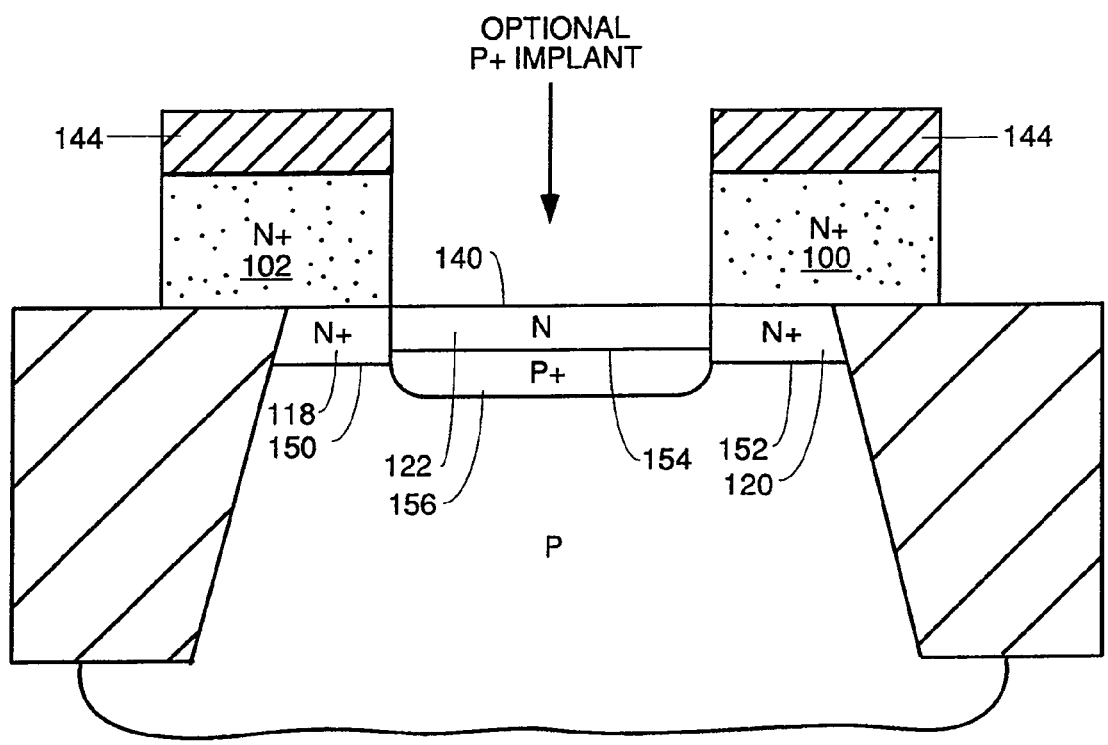
FIG. 10 is a cross section diagram of the structure after implanting N type dopants, typically of arsenic, to form the channel region 122.

FIG. 10 is a cross section diagram of the structure after implanting the channel region 122 in the active area to N type using arsenic or some other N type conductivity enhancing impurity, and after the thermal drive in. In the preferred embodiment, two or more channel implants are performed with dosages from $10^{11}$ to $10^{14}/cm^3$ and implant energies from 500 EV to 50 KEV. The implant energies are controlled to establish a junction depth for the channel-well junction 154 of from 5 NM to 200 NM below the surface 140. In the preferred embodiment, the dosage and the energies of the implants have to be coordinated such that the depth of junction 154 is such that the resulting concentration of impurities is such as to cause the portion of the depletion region (not shown) above junction 154 at positive bias across the junction to meet the portion of the depletion region (not shown) that extends below a gate-channel junction to be formed later so as to achieve pinchoff at positive gate bias if the device to be built is an enhancement mode device.

Figure 11:
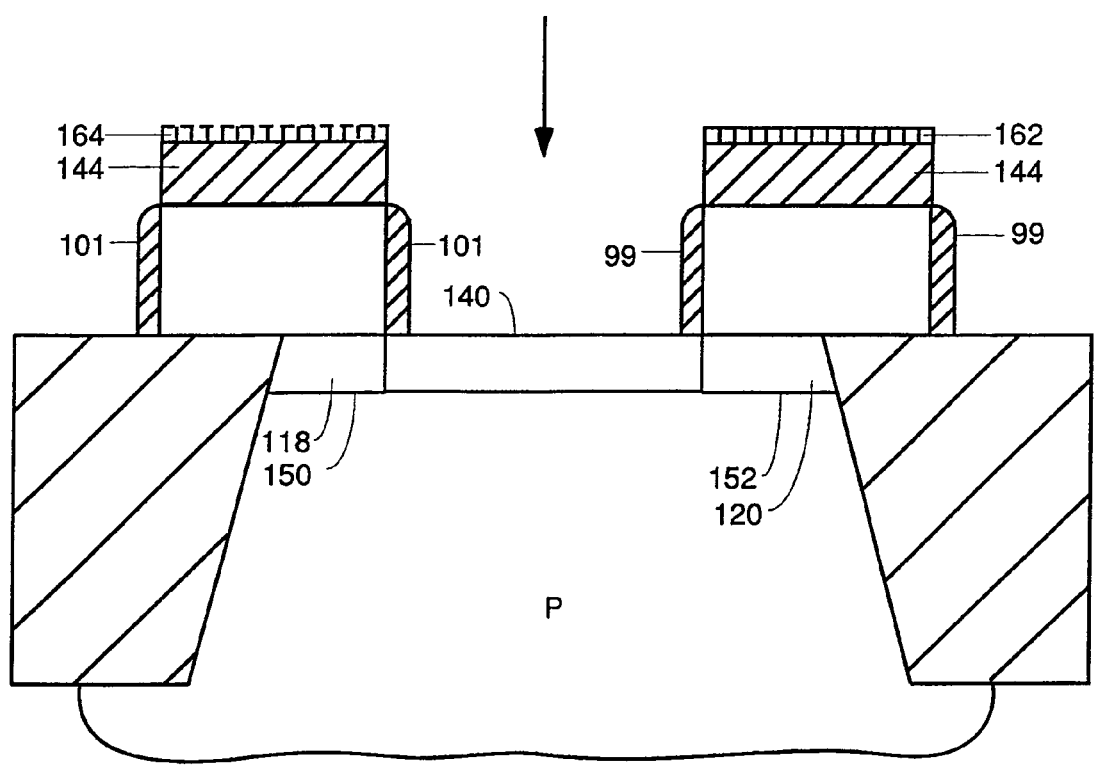
FIG. 11 is a cross-sectional view at a channel implant stage in an alternative embodiment for the process where thin oxide layers are formed on the sidewalls of the poly source and drain contacts before the channel implant.

FIG. 11 is a cross-sectional view at a channel implant stage in an alternative embodiment for the process where thin oxide layers 101 and 99 are formed on the sidewalls of the poly source and drain contacts before the channel implant. This is done to prevent dopants in the polysilicon source and drain contacts from outgassing during drive-in the first conductive layer and being deposited on the surface of the active area. The thin silicon dioxide layer is formed thermally using a short oxygen rich cycle within the rapid thermal annealing step after the channel implant or during the thermal drive in to cause impurities from the source and gate contacts to enter the underlying active area by thermal diffusion to form the source and drain regions.

Figure 12:
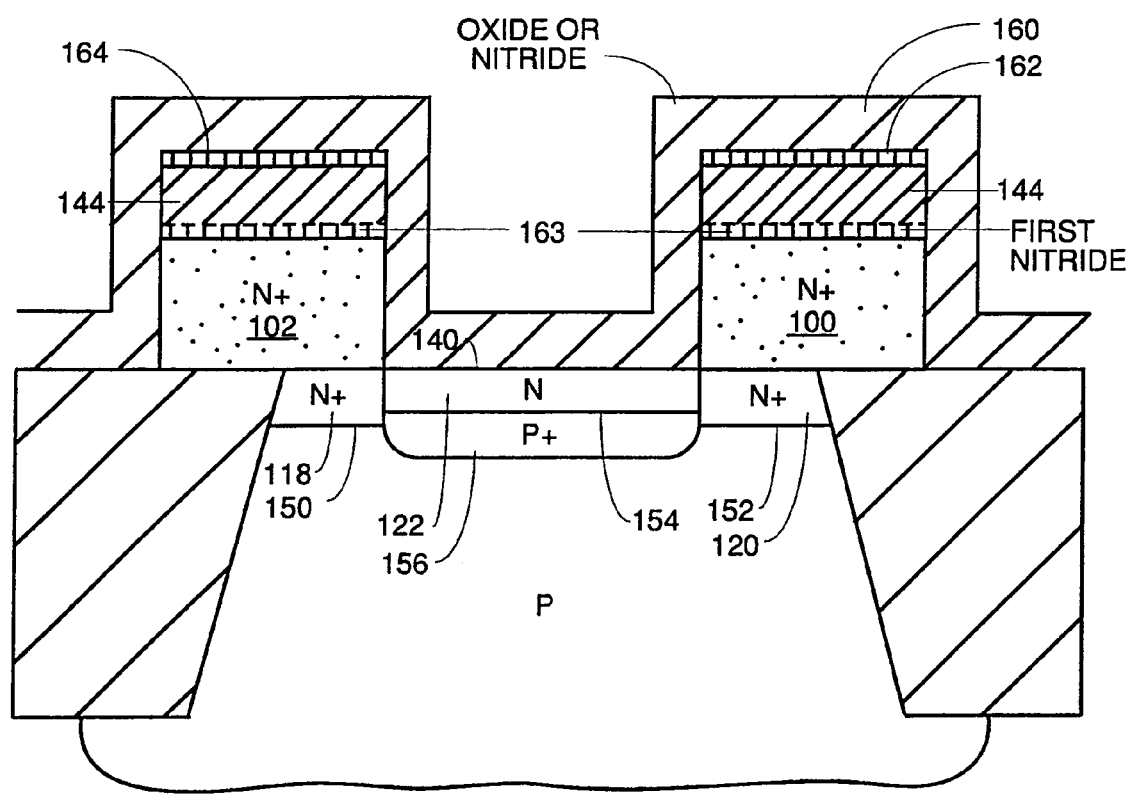
FIG. 12 is a cross sectional view of an alternative embodiment with a thin nitride layer 163 under the oxide layer 144 on top of source and drain contact and another nitride layer 164 and 162 over the source and drain contacts, respectively, and a dielectric layer 160 covering the whole wafer.

FIG. 12 shows a cross section of an embodiment of the structure after forming a second dielectric layer 160 over the source and drain contacts with nitride caps 164 and 162 on top of the oxide 144 on top of the source and drain contacts 102 and 104, respectively. A dielectric layer 160 is deposited on top of the wafer. This dielectric layer comprises a low k dielectric or a nitride layer. This dielectric layer is deposited isotropically over the whole wafer.

Figure 13:
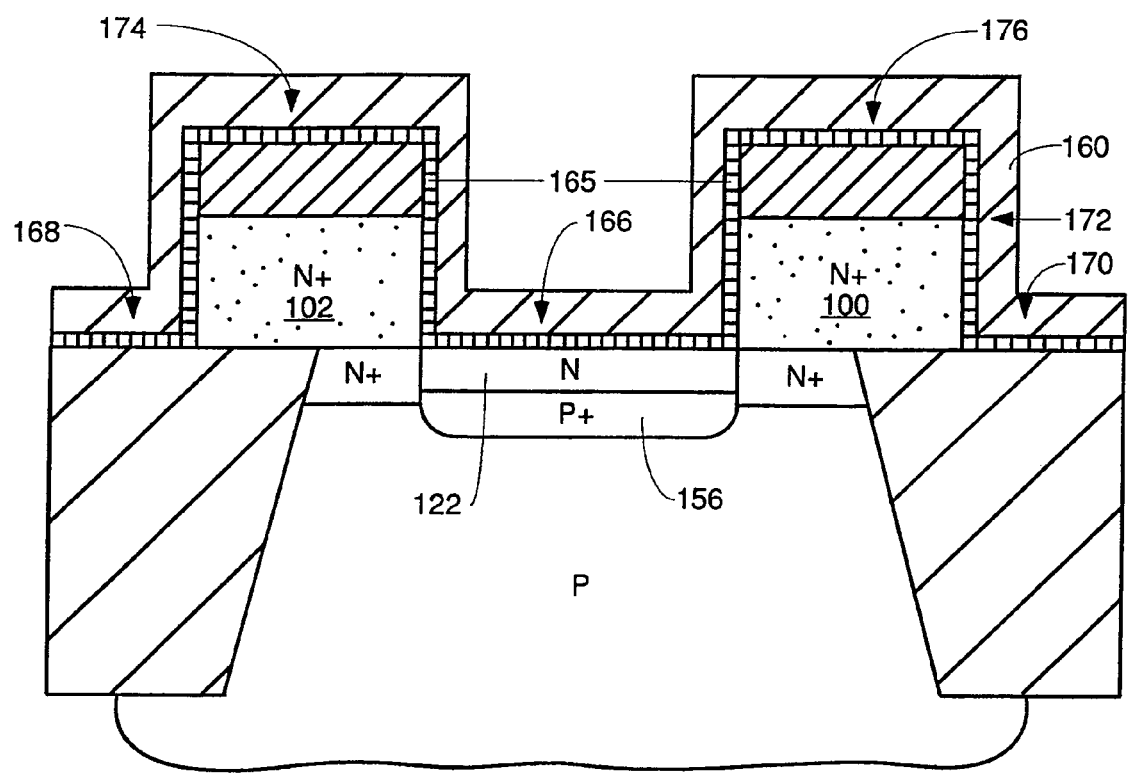
FIG. 13 shows a cross section of the preferred embodiment of the structure after forming a nitride layer 165 and another dielectric layer (silicon dioxide) 160 over the whole structure.

FIG. 13 is a cross section view of the preferred embodiment during the processing of the wafer showing a thin nitride layer 164 which is deposited isotropically over the whole wafer. In an alternate embodiment, this layer 164 comprises a very thin layer of oxide and a thin layer of nitride on top it. This stack will be referenced as the thin nitride layer 164. The thickness of the nitride layer is between 10 nm and 200 nm. A layer of an insulating material such as silicon dioxide 160 is deposited on the wafer following the nitride deposition. A low-k insulating material can also be deposited instead of the oxide layer. The thickness of the layer 176 varies depending upon the feature size of opening 140. The minimum thickness of the layer 176 is determined by the consideration that it has to maintain complete insulation between the two layers of polysilicon which are deposited across this layer.

Figure 14:
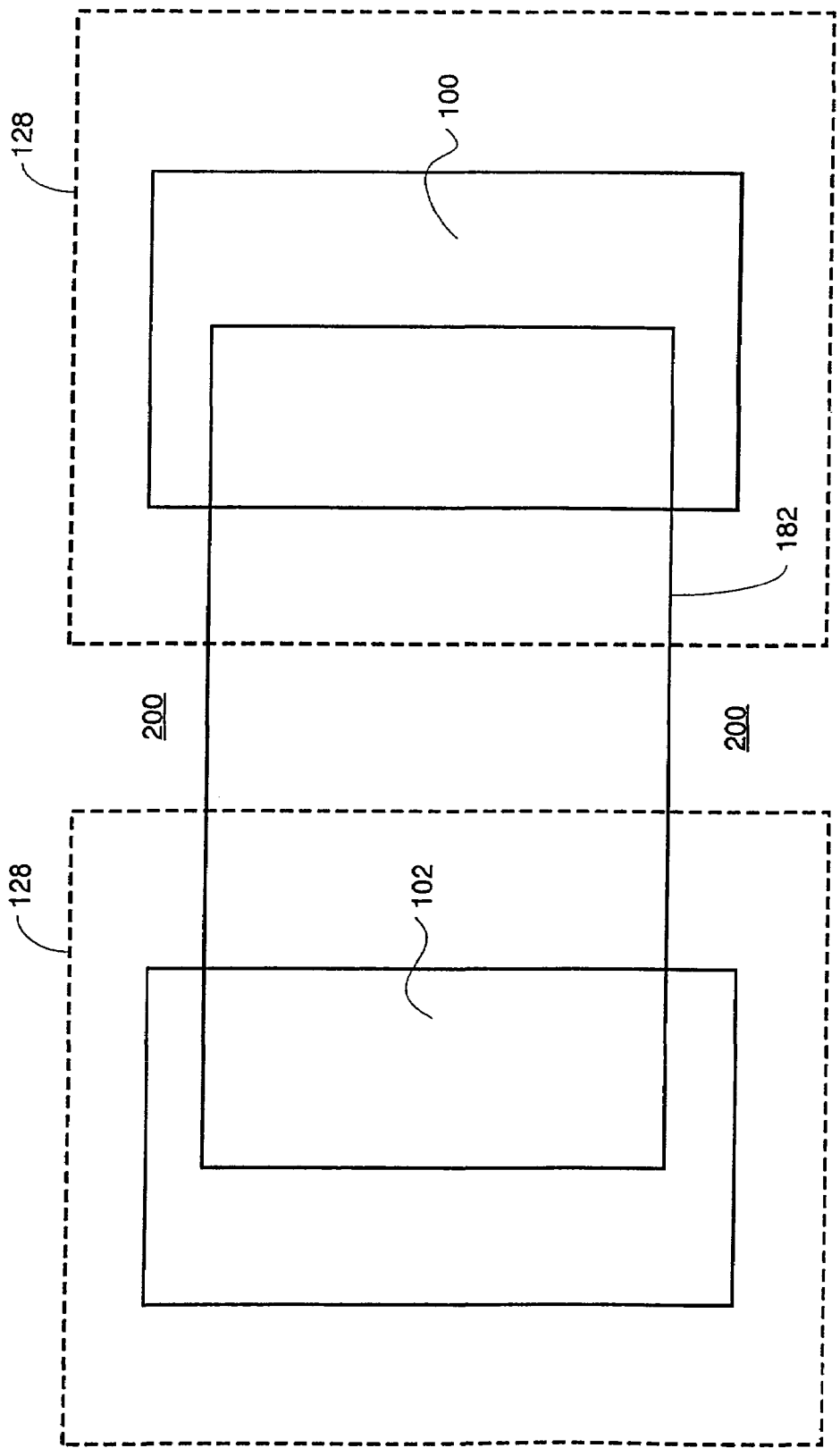
FIG. 14 is a plan view showing the outlines (in dashed lines) of the spacers (128) formed around the perimeters of the source contact 102 and the drain contact 100.
Figure 15:
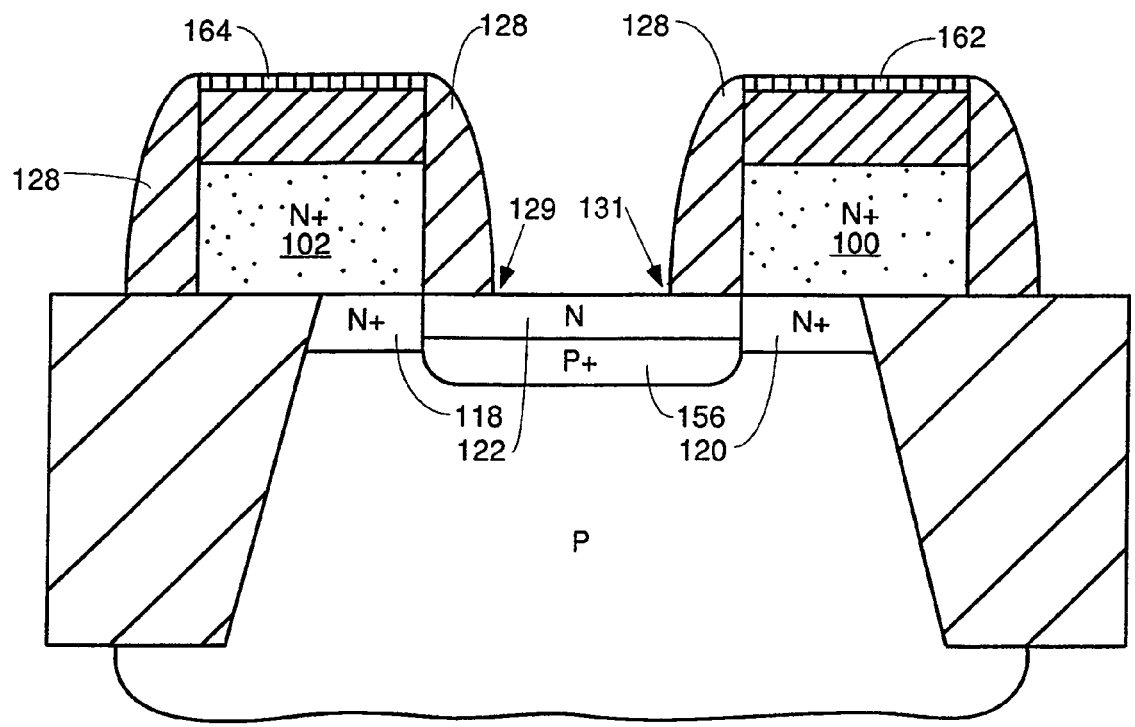
FIG. 15 shows a cross section of the structure after etching of the second dielectric layer 160 starting from the structure of FIG. 13 where the nitride layer 162 and 164 is only formed on top of the source and drain contacts.

The nitride in region 166 in FIG. 13 covering the active area, the outline of which is shown at 182 in FIG. 14, is selectively removed over the active area before deposition of second polysilicon. This is done so that the dopant impurities from the gate contact poly can be diffused into the underlying substrate to form the gate region 124 in FIG. 5C and form a low resistance contact to the well.

FIG. 15 shows a cross section of the structure after etching of the second dielectric layer 160 starting from the structure of FIG. 12 where the nitride layer 162 and 164 is only formed on top of the source and drain contacts. In this embodiment, the second dielectric layer 160 is nitride or low K silicon dioxide formed over the entire wafer so as to avoid etching the field oxide during formation of the spacers. An anisotropic etch removes the horizontal portions of second dielectric layer over the source and drain contacts 102 and 100, and removes the horizontal portion of second dielectric layer over the active area so as to leave the surface of the substrate and channel region 122 exposed, and removes the horizontal portions of second dielectric layer over the field oxide without etching the field oxide. The anisotropic etch leaves spacer dielectric portions 128 which cover the sidewalls of the source and drain contacts so as to insulate them from the gate polysilicon which is to be deposited next.

The purpose of these nitride caps 162 and 164 is to act as an etch stop to protect the insulating layer 144 on top of each of the source and drain contacts from being etched away when the spacer dielectric layer 160 is etched to form the spacers. The first dielectric layer 144 must stay on top of the source and drain contacts so as to prevent the tops of these contacts from being exposed in the etch of the space dielectric layer 160. If the tops of the source and drain contacts are exposed during this etch, a short will result when the second polysilicon layer is deposited over the structure. If dielectric layer 144 is nitride, there is no need for the nitride cap layer 162 and 164. If dielectric layer 144 is oxide, it must have at least a nitride cap 164 and 162 if not a nitride layer covering all facets (tops and side walls) of the source and drain contacts as shown in FIG. 13. In this particular embodiment, second dielectric layer 160, referred to in the claims as second dielectric, is preferably nitride. This is because in this embodiment, there is no separate layer of nitride protecting the field oxide so layer 160 must be nitride to prevent the field oxide from being etched with layer 160 when it is etched to form the spacer dielectric structures. If second dielectric layer 160 is made of regular oxide, when it is etched to form the spacers 128 in FIGS. 5C and 5D, it could result in overetching of the field oxide outside the spacer dielectric structure 128 in FIG. 5A. This could lead to short between the gate and the well, when the gate is formed by depositing second polysilicon during the wafer processing. Etching of low K oxide is preferential and stops at the field oxide so low K oxide could possibly be used in some embodiments for second dielectric layer 160. The term second dielectric layer in the claims should be interpreted to cover all these possibilities. A relatively thick dielectric layer 144 is also needed in the preferred embodiment to provide more separation between the first conductive layer source and drain contacts 102 and 100 and the second conductive layer, i.e., second poly (not shown yet at this stage in the construction).

Figure 16:
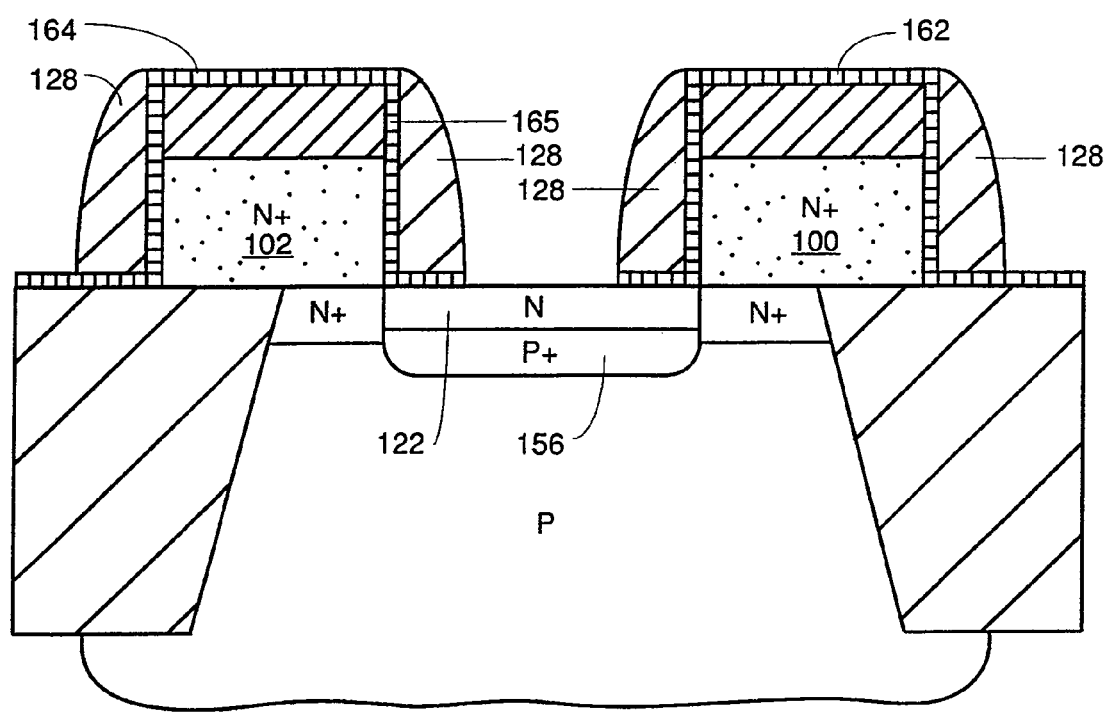
FIG. 16 is a cross section of the structure after etching the second dielectric layer 160 starting from the structure of FIG. 12 where the nitride layer is formed over the entire wafer under the second oxide layer.

FIG. 16 is a cross section of the structure after etching the second insulating layer 160 starting from the structure of FIG. 13 where the nitride layer is formed over the entire wafer. Spacer dielectrics 128 around the perimeter of the source and drain contacts are formed by anisotropically etching the second oxide layer to remove all horizontal portions. That removes the horizontal portions of the second oxide layer down to the nitride layers 162 and 164 on top of the source and drain contacts 102 and 100 and down to the nitride layer covering the field oxide and the active area. A nitride etch is then performed to remove the nitride over the active area and expose the surface of the substrate and the channel regions.

Returning to consideration of the preferred class of embodiments, FIG. 14 is a plan view showing the outlines of the spacer dielectric structures 128 formed around the perimeters of the source contact 102 and the drain contact 100. These spacers 128 are formed by etching the second oxide layer 160. Because the nitride layer 165 formed on the surface of the substrate in regions 168 and 170 covers the STI field oxide, the nitride layer 165 protects the STI from any etching and resultant notching during etch of the second oxide layer 160. Etching of the STI to a level below the surface of the rest of the substrate can cause the gate polysilicon to short directly to the well thereby rendering the device inoperative or severely restricting its performance. The embodiment of FIGS. 13 and 14 or any embodiment where there is a nitride layer which protects the Shallow Trench Isolation is preferred over embodiments where there is no protection for the STI during the second oxide etch.

Figure 17:
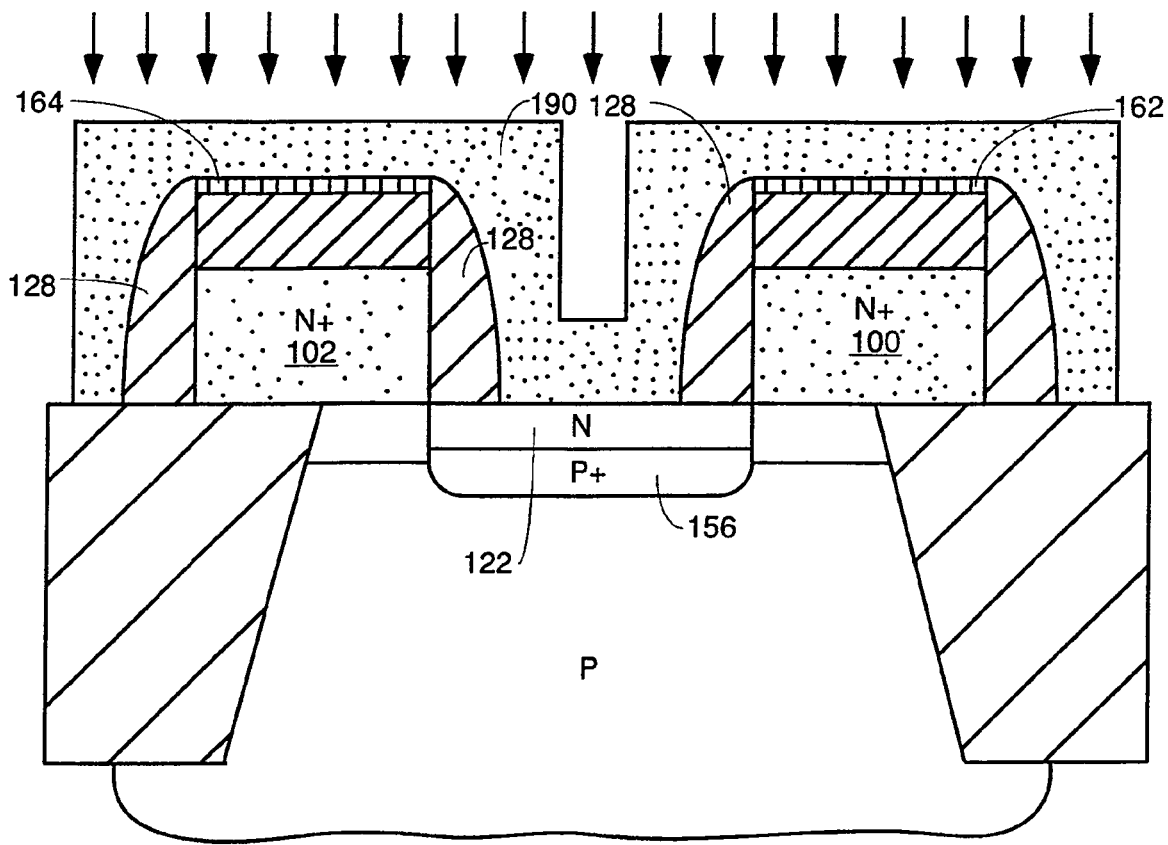
FIG. 17 shows a cross section of the structure after formation of a second conductive layer 190 which is typically polysilicon, starting from the structure of FIG. 15 where nitride is only on top of said source and drain contacts.

FIG. 17 shows a cross section of the structure after formation of a second conductive layer 190 which is typically polysilicon starting from the structure of FIG. 15 where nitride is only on top of said source and drain contacts. The second poly layer 190 is typically 10 NM to 500 NM thick. It is formed by low pressure chemical vapor deposition or another suitable process known to those skilled in the art. The gate contact will be formed from this conductive layer 190 so it needs to be a P+ conductive material for an N channel device or an N+ conductive material for a P channel device. Therefore, second polysilicon layer 190 either needs to be doped after deposition or the deposited material must already be doped when deposited or be doped as it is deposited. In the preferred embodiment, the second poly is doped by ion implantation in one or more implants. For an N-channel device, the implant dopant is typically BF2 implanted at 1 KEV to 50 KEV energy levels (multiple implants at different energy levels are typical) with a concentration of $1 \times 10^{14}$ to $1 \times 10^{16}/cm^2$. A low temperature annealing step is performed after the implant(s) to distribute the implanted ions evenly. Typical annealing steps are carried out at 600 to 800 degrees C. for 10 seconds to 6 hours. This annealing step can be done before further processing of the second polysilicon layer 190 to form the gate contact. A high temperature drive in step can be performed at this point to drive in the impurities from the second poly layer 190 into the active area below to form gate region 124 in FIG. 5C. Alternatively, the second polysilicon may be further processed as described below to remove excess polysilicon to form the gate contact, and then the high temperature drive in step can be performed.

Figure 18:
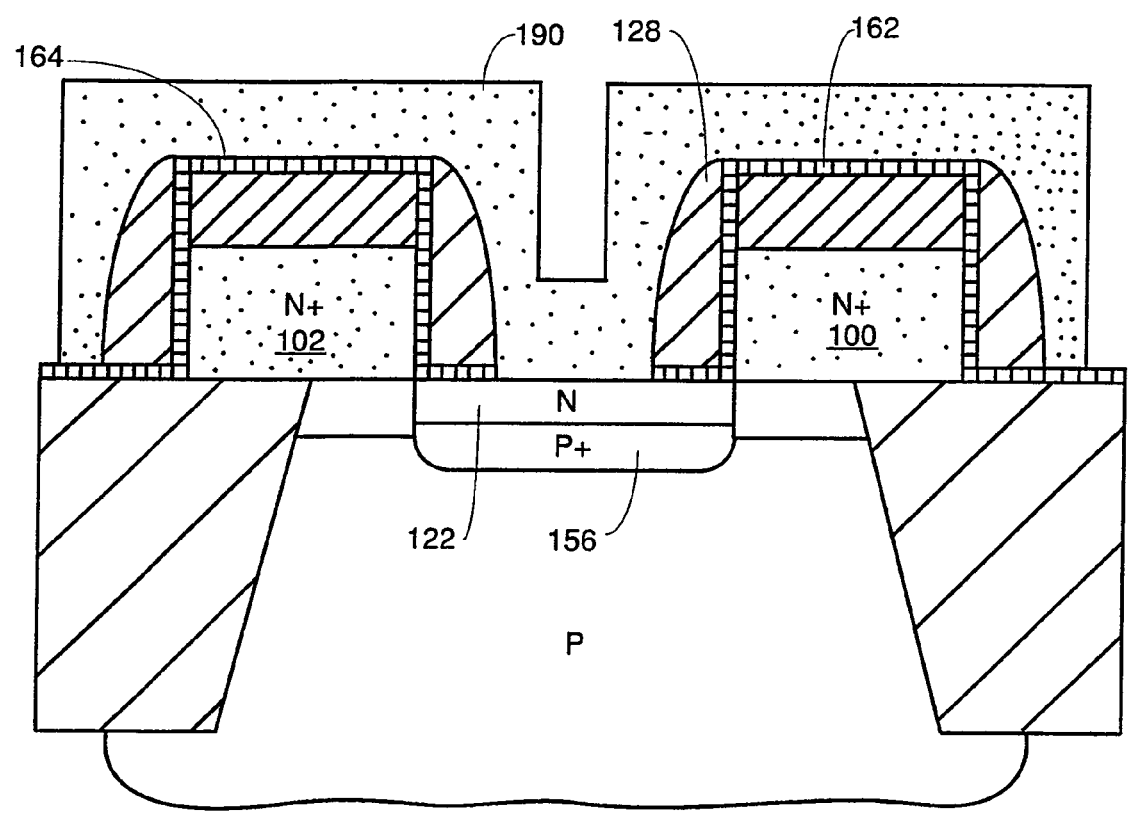
FIG. 18 is a cross section through the structure in an embodiment of the process after the second conductive layer is deposited starting from the structure of FIG. 16 where nitride has been deposited over the entire structure after formation of the source and drain contacts.

FIG. 18 is a cross section through the structure in an embodiment of the process after the second conductive layer is deposited starting from the structure of FIG. 16 where nitride has been deposited over the entire structure after formation of the source and drain contacts. All aspects of the deposition and doping of the second polysilicon layer 190 described previously with respect to FIG. 17 apply equally here.

Figure 19:
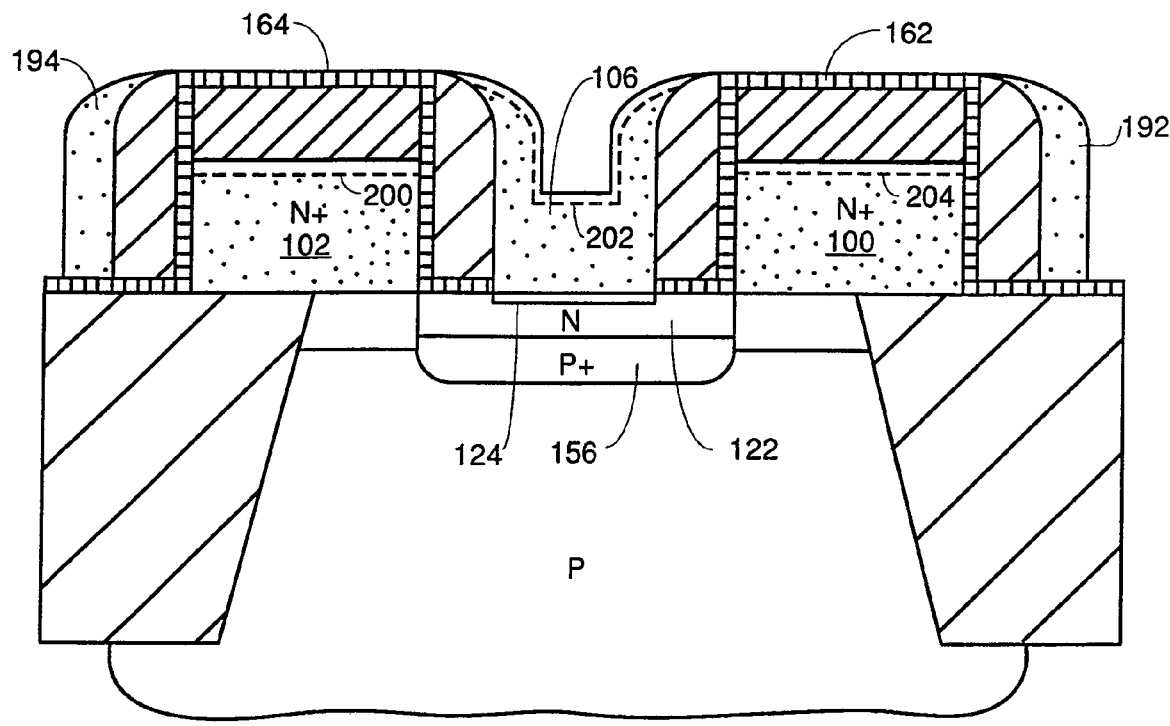
FIG. 19 is a cross section through the structure after polishing off excess polysilicon of layer 190 to planarize it so as to be flush with the top of nitride caps 162 and 164 starting from the embodiment of FIG. 18 where a nitride layer covers the field oxide.

FIG. 19 is a cross section through the finished structure after polishing off excess polysilicon of layer 190 to planarize it so as to be flush with the top of the dielectric layers 162 and 164 to leave gate contact 106 starting from the embodiment of FIG. 18 (where a nitride layer covers the STI). If the high temperature drive in step has not already been performed, it is performed at this point to drive impurities from the gate contact into the underlying active area channel region 122 to form gate region 124.

Figure 20:
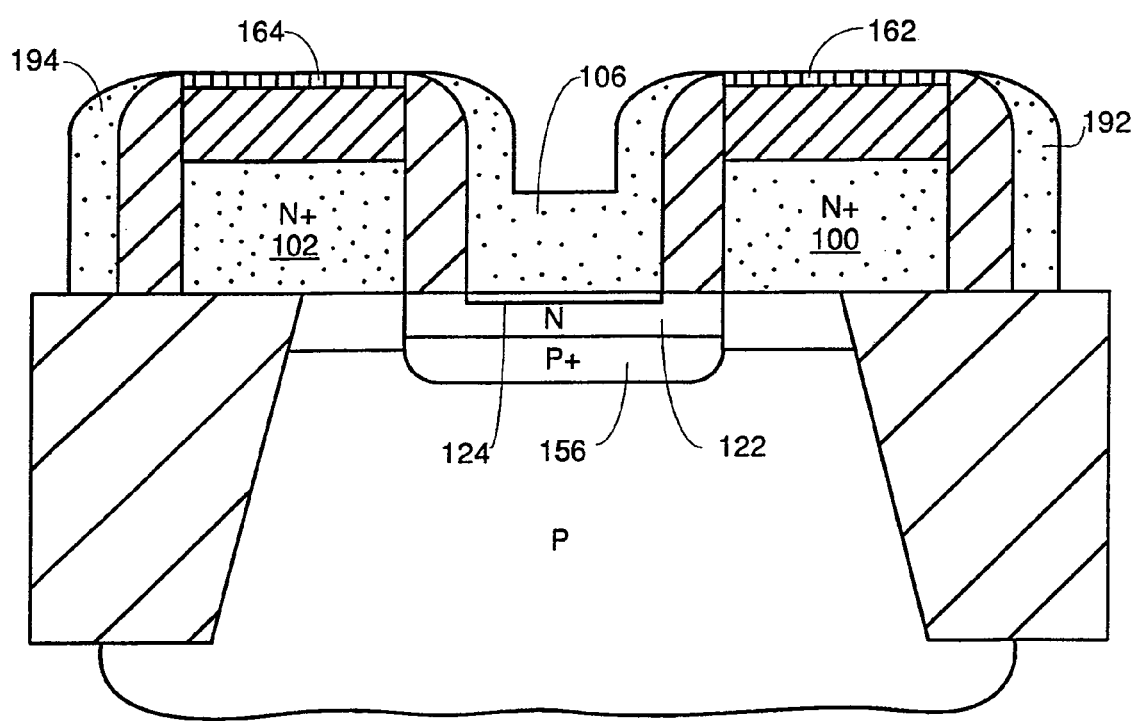
FIG. 20 is a cross section through the structure after polishing off excess polysilicon of layer 190 to planarize it so as to be flush with the top of nitride caps 162 and 164 to starting from the embodiment of FIG. 17 where a nitride layer covers only the tops of the source and drain contacts.

FIG. 20 is a cross section through the structure after polishing off excess polysilicon of layer 190 to planarize it so as to be flush with the top of nitride caps 162 and 164 to leave gate contact 106 starting from the embodiment of FIG. 17 where a nitride layer covers only the tops of the source and drain contacts.

For the higher performance finished embodiment of FIG. 5C, the polysilicon extraneous spacers 192 and 194 of second poly around the outside edges of the source and drain contacts which are not over the active area can be etched away by selecting masking and etching to remove them.

In an alternative embodiment, a layer of silicide can be formed on top of said gate, source and drain contact polysilicon so as to reduce the resistance thereof. That embodiment is represented by dashed lines 200, 202 and 204 in FIG. 19 and is applicable in all embodiments.

A first alternative embodiment involves forming a channel region on top of the substrate by epitaxial growth of a layer of semiconductor. This alternative embodiment is represented by FIGS. 22 through 25 which represent the state of the structure at various stages of the alternative process. This alternative process embodiment starts after the poly 1 etch step and after the spacers are formed and the drive in step has taken place. The alternative process is as follows. All the alternative embodiments for each of the steps from the preferred embodiment which are in common with this alternative embodiment are separate species of this alternative embodiment.

1) Define active area in substrate and do a lightly doped well implant to P 10 type (for an N channel device) to create a structure as shown in FIG. 6.

2) Deposit the first polysilicon layer (poly 1) and implant to N type (or P type if doing a P channel device) and forming a first dielectric layer on top thereof (FIGS. 7 and 8).

Figure 22:
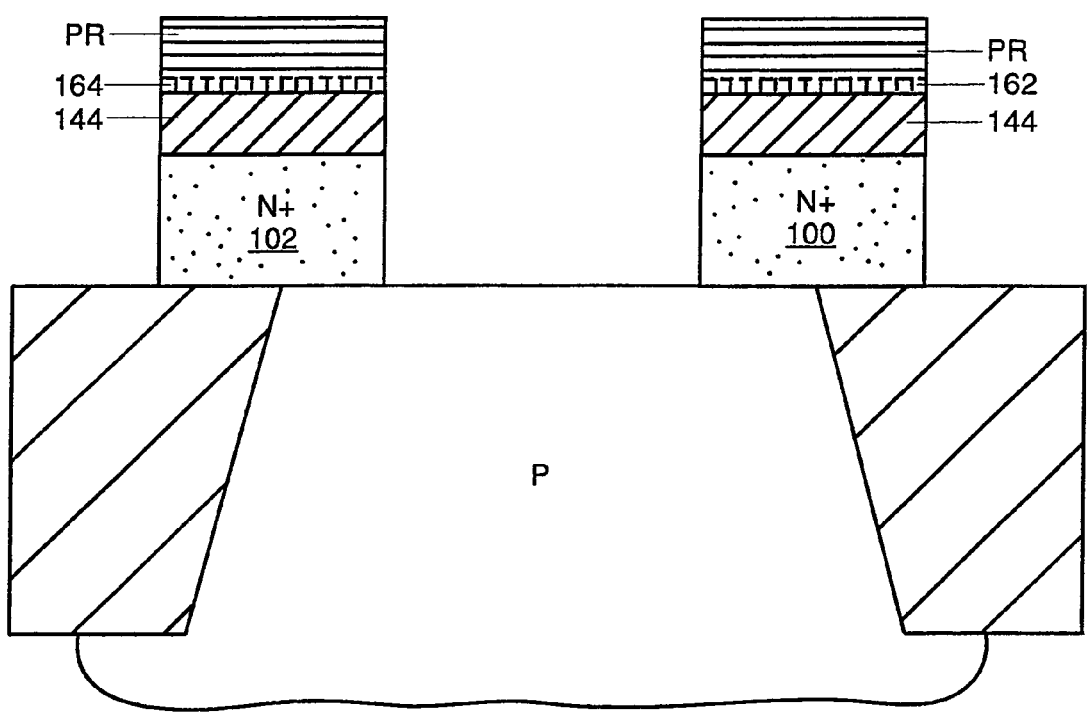
FIG. 22 is a cross section through the structure after poly 1 etch in the alternative epi layer channel embodiment.

3) Etch the poly 1 layer to form the source and drain contacts and form the dielectric caps on top of each said contact. The structure is left as shown in FIG. 22. In the claims, the step "forming a first dielectric layer on said first polysilicon layer" means all the variants of CVD oxide alone, CVD oxide on top and thermal oxide on the sidewalls, CVD oxide and nitride, nitride alone or any other dielectric structure disclosed herein or apparent to those skilled in the art and means either on the top of the source and drain contacts alone or covering the tops and sidewalls of the source and drain contacts with nitride at least covering STI areas outside the active area in some embodiments and not in others. Therefore some of the steps of forming the first dielectric layer may be done before the poly 1 etch followed by additional steps later to form dielectric layers on the sidewalls.

Figure 23:
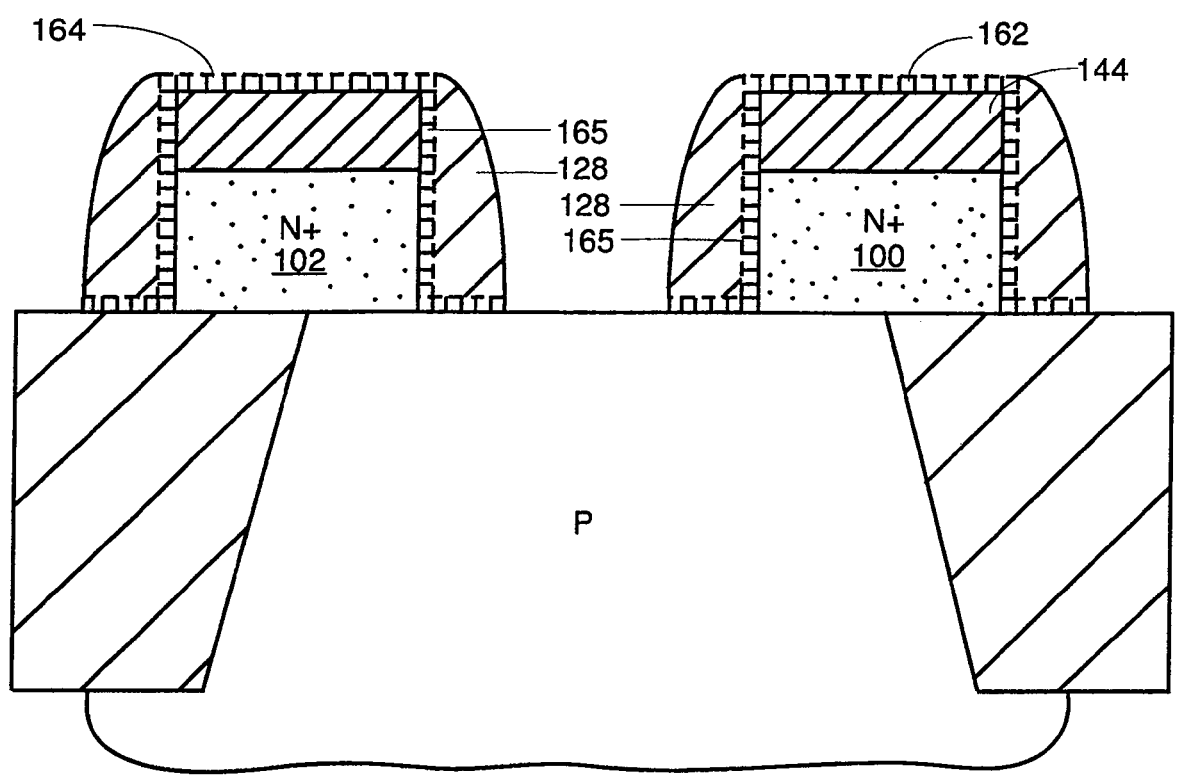
FIG. 23 is a cross section through the structure in the alternative epi layer channel embodiment after formation of the spacers 128.

4) Form the spacer dielectric structures 128 either with or without thermal oxide or nitride or both under the spacer dielectric (FIG. 23). FIGS. 11, 12, 13, 14, 15 and 16 all define alternative embodiments for forming these spacers 128 all of which are applicable to this alternative epi layer channel class of processes. Optional nitride layers 162 and 164 covering the top and nitride layer 165 covering the sidewalls of the source and drain contacts are represented by dashed lines in FIG. 23. In the claims, the phrase "forming spacer dielectric structures" means forming any combination of dielectric layers taught in the specification for the spacers including thermal oxide grown on the sidewalls covered by a CVD oxide layer which has been anisotropically etched and nitride covering the sidewalls covered by a CVD oxide layer which has been anisotropically etched to remove its horizontal components.

Figure 24:
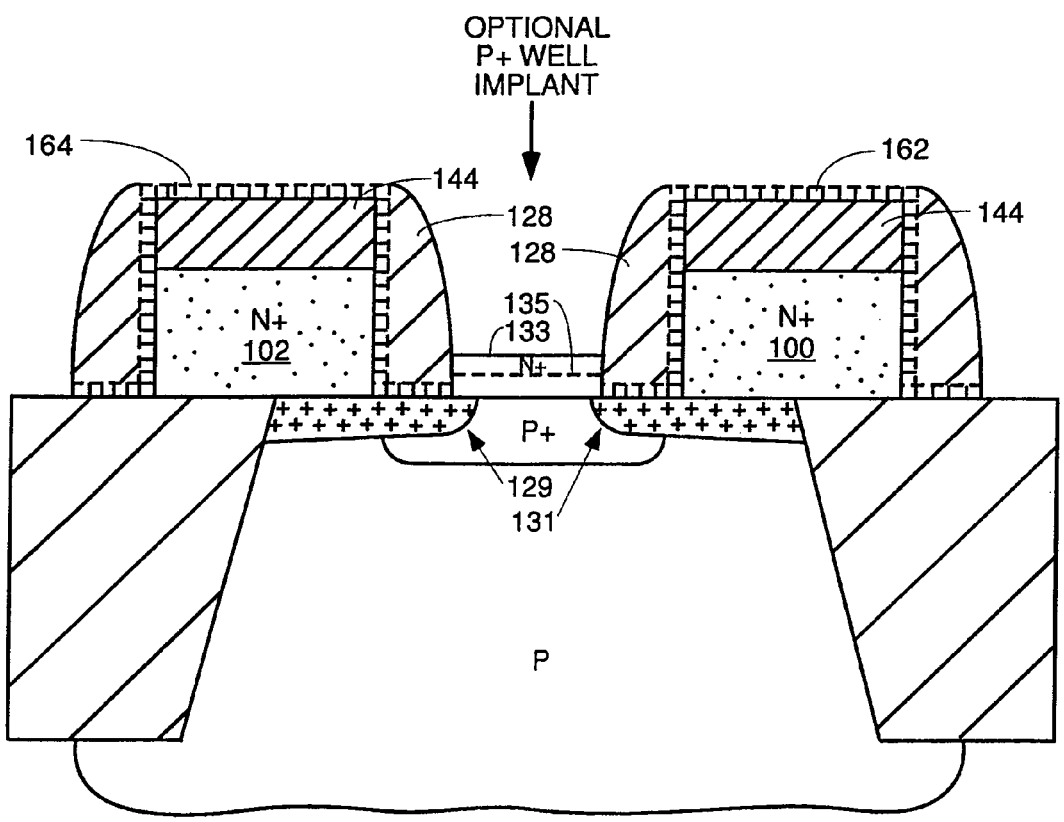
FIG. 24 is a cross section through the structure in the alternative epi layer channel embodiment after formation of the source and drain regions, the epi layer 20 and the ohmic contacts between the source and drain regions and the epi layer.

5) Perform a thermal drive in to drive N+ conductivity enhancing impurities in the source and drain contacts into the substrate to form the source and drain regions 118 and 120 and laterally out through the top semiconductor layer of the substrate to the inner fringes of the spacers shown at 129 and 131 in FIG. 15 so impurities are at the surface of the substrate both under the spacers and inside spacers in hole where the gate contact will be formed (FIG. 24).

6) Do an optional P+ well implant right under where the channel is going to be and then grow a channel region on top of the substrate by growing an epitaxial layer of single crystal semiconductor 133 (hereafter the epi layer). In one embodiment, a first silicon-germanium layer 135 is grown with a pure silicon layer 133 grown on top of the layer 135. This is the preferred species because the lattice mismatch strains the silicon layer 133 and causes it to have high mobility. In another embodiment, semiconductor layer 133 is a pure silicon single layer. In another embodiment, semiconductor layer 133 is an epitaxial silicon layer on top of epitaxial silicon-germanium-carbon alloy single crystal layer. In another embodiment, semiconductor layer 133 is a strained layer epitaxial silicon layer on top of epitaxial silicon-germanium-carbon alloy single crystal layer. The layer 133 acts as a channel region and is doped N+ for an N channel device. It can be doped in situ as it is deposited or doped later by ion implantation. The impurities at the surface of the substrate at 129 and 131 form ohmic contacts with the epi layer 133 to act as source and drain regions (FIG. 24). Process conditions for epitaxial growth of semiconductor layers are well known and have been practiced in the bipolar transistor arts for years. Layers 135 and 133 are doped appropriately to form the channel with N type dopants, preferably arsenic by ion implantation.

Figure 25:
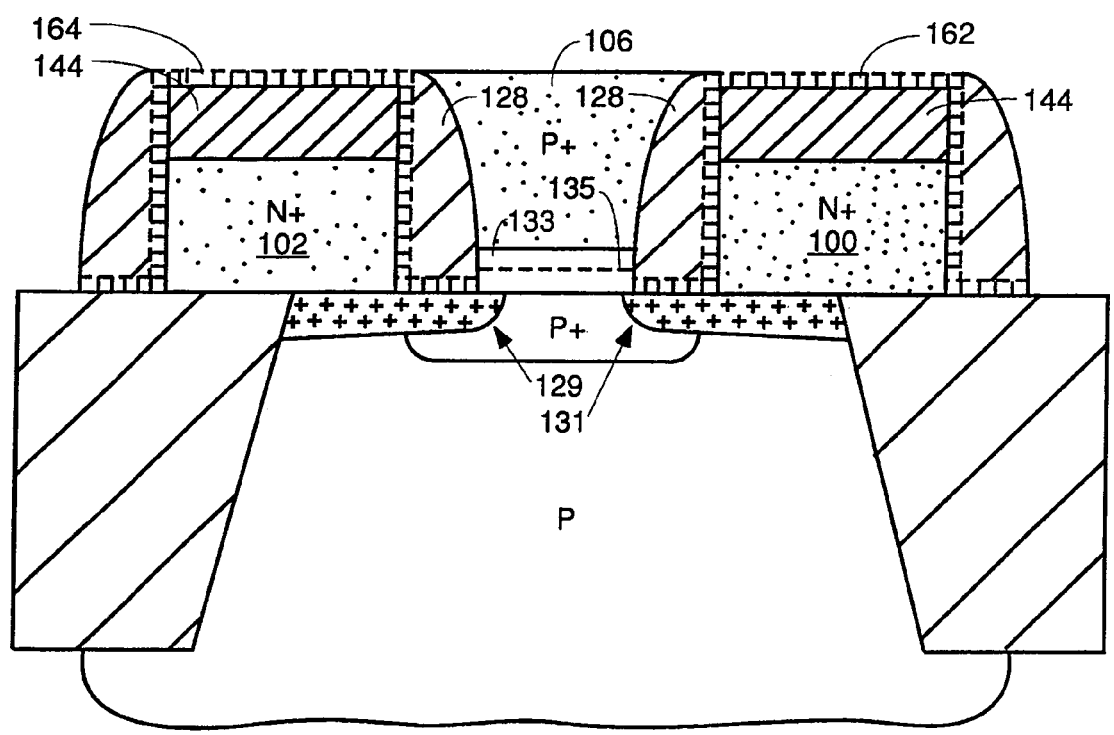
FIG. 25 is a cross section through the final structure in the alternative epi layer channel embodiment after formation of the gate contact 106 over the epi layer.

7) Deposit a second layer of polysilicon (second poly) on top of epi layer to fill the hole, dope it to the appropriate conductivity type (P+ for an N channel device) and polish it back to the top of the nitride layers 162 and 164 on top of the source and drain contacts to form gate contact 106 (FIG. 25). Doping of the second polysilicon can be by either diffusion of impurities into it or by ion implantation of impurities, typically multiple implants at different energy levels being used to achieve good distribution of impurities.

8) Perform a thermal drive in of impurities from the gate poly to form the gate region in the epi layer. In an alternative embodiment, the gate region can be formed by implanting the gate region either before or after deposition of polysilicon in the opening over the active area between the spacer dielectric structures to form the gate contact. Multiple implants at different energy levels for better distribution of impurities can be used. The same junction depth and doping concentrations to cause pinchoff at positive gate bias as are described elsewhere herein apply to the alternative process and structure if an enhancement mode device is to be built. If a depletion mode device is to be built with an epi layer on top of the substrate, the junction depths of the gate-channel junction and the channel-well junction and doping concentrations of the gate, channel and well regions are controlled so as to achieve depletion mode operation, i.e., pinchoff at some predetermined negative gate bias.

After the second polysilicon is defined by masking and etching, a layer of dielectric is deposited on the wafer and contact holes are etched in the dielectric layer. Finally, metal is deposited and etched to form the electrical connections.

Although the invention has been disclosed in terms of the preferred and alternative embodiments disclosed herein, those skilled in the art will appreciate that modifications and improvements may be made without departing from the scope of the invention. All such modifications are intended to be included within the scope of the claims appended hereto.

What is claimed is:

1. A process for forming a junction field effect transistor, comprising:
   forming a source contact region and a drain contact region on a substrate in an isolated section thereof;
   forming a source region and a drain region in the substrate beneath the source contact region and the drain contact region respectively;
   forming a channel region in an active area of the substrate between the source and drain regions;
   forming a dielectric region around each of the source contact region and drain contact region;
   forming a gate contact region, separately from the source contact region and drain contact region, on the channel region between the source contact region and drain contact region, wherein forming the source contact region, drain contact region, and gate contact region is performed using a single photoresist mask layer, wherein the dielectric region separates the gate contact region from each of the source contact region and drain contact region;
   forming a gate region in the channel region beneath the gate contact region.

2. A process for forming a junction field effect transistor, comprising:
   forming a source contact region and a drain contact region on a substrate in an isolated section thereof, the source and drain contact regions being formed by:
      depositing a first layer of semiconductor material on the substrate;
      doping the first layer of semiconductor material with impurities of a first type;
      depositing a first dielectric layer on the first layer of semiconductor material;
      selectively placing a layer of photoresist material over the first layer of semiconductor material in desired locations for the source contact region and drain contact region;
      etching away the first layer of semiconductor material not covered by the layer of photoresist material to establish the source contact region and drain contact region and the active area;
   forming a source region and a drain region in the substrate beneath the source contact region and the drain contact region respectively, the source and drain regions being formed by:
      removing the layer of photoresist material from the source contact region and drain contact region;
      baking the source contact region and drain contact region to thermally drive in impurities in the source contact region and drain contact region so that the impurities diffuse into the substrate to form the source and drain regions;
   forming a channel region in an active area of the substrate between the source and drain regions;
   forming a second dielectric layer around each of the source contact region and drain contact region;
   forming a gate contact region on the channel region between the source contact region and drain contact region, wherein forming the source, drain, and gate contact regions is performed using a single photoresist mask layer, wherein the second dielectric layer separates the gate contact region from each of the source contact region and drain contact region, wherein the formation of the source contact region and drain contact region allows for self alignment of the gate contact region and gate region therebetween, the gate contact region being formed by:
      etching the second dielectric layer in the active area to expose the channel region and leave dielectric spacers in contact with the source contact region and drain contact region;
      depositing a second layer of semiconductor material on the exposed channel region and over the source contact region and drain contact region;
      doping the second layer of semiconductor with impurities of a second type to form the gate contact region on the channel region;
   forming a gate region in the channel region beneath the gate contact region, the gate region being formed by:

baking the gate contact region to thermally drive in impurities in the gate contact region so that the impurities diffuse into the channel region to form the gate region;

polishing down to remove excess polysilicon over said source and drain contact regions.

3. The process of claim 1, wherein the channel region is formed in the substrate.

4. The process of claim 1, wherein the channel region is formed on top of the substrate.

5. The process of claim 1, further comprising:
forming a well implant region in the substrate beneath the channel region.

6. The process of claim 1, further comprising:
forming a thin oxide layer on sidewalls of the source and drain regions prior to formation of the channel region to prevent source and drain dopants from being driven into the active area.

7. The process of claim 1, further comprising:
selective forming a cap layer over the source region, the drain region, and the channel region prior to formation of the dielectric layer.

8. The process of claim 1, wherein forming the source and drain region includes forming an insulating region on the source and drain regions.

9. The process of claim 1, further comprising:
driving impurities through the gate contact region into a portion of the channel region to form the gate region.

10. The process of claim 1, further comprising:
driving impurities through the source contact region and drain contact region into the substrate to form the source and drain regions.

11. The process of claim 1, wherein the source, drain, and channel regions are formed with a n type dopant profile and the gate region is formed with a p type dopant profile.

12. The process of claim 1, wherein the source, drain, and channel regions are formed with a p type dopant profile and the gate region is formed with a n type dopant profile.

13. The process of claim 1, wherein the source contact region and drain contact region and the source and drain regions are formed by:
depositing a first layer of semiconductor material on the substrate;
doping the first layer of semiconductor material with impurities of a first type;
selectively placing a layer of photoresist material over the first layer of semiconductor material in desired locations for the source contact region and drain contact region;
etching away the first layer of semiconductor material not covered by the layer of photoresist material to establish the source contact region and drain contact region and the active area;
removing the layer of photoresist material from the source contact region and drain contact region;
baking the source contact region and drain contact region to thermally drive in impurities in the source contact region and drain contact region so that the impurities diffuse into the substrate to form the source and drain regions.

14. The process of claim 1, wherein the formation of the source contact region and drain contact region allows for self alignment of the gate contact region and gate region therebetween.

15. The process of claim 1, wherein a doping impurity type and concentration of the gate region, the source and drain regions, and the channel region and depths of a gate-channel junction and a channel-substrate junction are selected so as to achieve pinchoff at a predetermined gate bias in order to provide enhancement mode or depletion mode operation.

16. The process of claim 13, wherein the gate contact region and the gate region are formed by:
etching the dielectric region in the active area to expose the channel region;
depositing a second layer of semiconductor material on the exposed channel region and over the source contact region and drain contact region;
doping the second layer of semiconductor with impurities of a second type to form the gate contact region on the channel region;
baking the gate contact region to thermally drive in impurities in the gate contact region so that the impurities diffuse into the channel region to form the gate region.

17. The process of claim 2 wherein the first layer of semiconductor material is selected from a group comprising polysilicon, refractory metal, and silicide, the first layer of semiconductor material is doped using one or more implant steps to a high concentration level, the polysilicon is annealed to distribute the doped impurities evenly, and further comprising the step of performing a deep well implant of impurities of said second conductivity type to form an area of high concentration of second conductivity type impurities adjacent and below said channel-substrate junction.

18. The process of claim 2, wherein said first dielectric layer is selected from a group comprising nitride, silicon nitride, silicon dioxide, carbon doped silicon dioxide, or combinations thereof.

19. The process of claim 2, wherein forming the second dielectric layer includes forming a layer of silicon nitride over the entire wafer including over the first dielectric layer formed on top of the source and drain contact regions and then forming a layer of silicon dioxide which covers the whole structure including the layer of silicon nitride.

20. The process of claim 19, wherein forming the gate contact region includes anisotropically etching the second dielectric layer to leave uniform vertical portions of the second dielectric layer at sidewalls of the source contact region and drain contact region to provide spacer dielectric structures separating the source and drain contact regions from the gate contact region when exposing the channel region.

* * * * *